(12) United States Patent
Tsuchi

(10) Patent No.: US 11,670,216 B2
(45) Date of Patent: Jun. 6, 2023

(54) DIGITAL-TO-ANALOG CONVERSION CIRCUIT, DATA DRIVER, AND DISPLAY DEVICE

(71) Applicant: LAPIS Semiconductor Co., Ltd., Yokohama (JP)

(72) Inventor: Hiroshi Tsuchi, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 17/379,970

(22) Filed: Jul. 19, 2021

(65) Prior Publication Data

US 2022/0036801 A1   Feb. 3, 2022

(30) Foreign Application Priority Data

Jul. 31, 2020   (JP) .............................. JP2020-130512

(51) Int. Cl.
*G09G 3/20* (2006.01)
*H03M 1/76* (2006.01)
*H03M 1/68* (2006.01)

(52) U.S. Cl.
CPC .......... *G09G 3/2092* (2013.01); *H03M 1/682* (2013.01); *H03M 1/765* (2013.01); *G09G 2310/027* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,023,417 B2* | 4/2006 | Bily | ..................... | G09G 3/3688 345/99 |
| 8,823,570 B2* | 9/2014 | Tsuchi | .................. | G09G 3/3688 341/145 |
| 2002/0033763 A1* | 3/2002 | Nakao | .................... | H03M 1/682 341/154 |

(Continued)

FOREIGN PATENT DOCUMENTS

| | | |
|---|---|---|
| JP | 2000183747 | 6/2000 |
| JP | 2002043944 | 2/2002 |
| JP | 2009284310 | 12/2009 |

*Primary Examiner* — Van N Chow
(74) *Attorney, Agent, or Firm* — JCIPRNET

(57) ABSTRACT

A digital-to-analog conversion circuit, a data driver including the same, and a display device are provided. The circuit includes: a reference voltage generation part, generating a reference voltage group having different voltage values; a decoder, selecting and outputting multiple reference voltages with overlapping from the reference voltage group based on the digital data signal; an amplification circuit, where m (m being an integer of 1 or more and less than x) of first to $x^{th}$ input terminals respectively receive m of multiple reference voltages, and, as an output voltage, a voltage amplified by averaging the voltages respectively received by the first to $x^{th}$ input terminals with predetermined weighting ratios is output; and a selector, which, in a first selection state, supplies the output voltage to (x-m) input terminals among the first to $x^{th}$ input terminals, and in a second selection state, supplies the reference voltages to the (x-m) input terminals.

13 Claims, 14 Drawing Sheets

| N: Number of output terminals of decoder circuit | X: Number of input terminals of amplification circuit | Weighting ratio |
|---|---|---|
| 2 : (P1, P2) | 2 : (T1, T2) | (1 : 1) |
| 3 : (P1, P2, P3) | 4 : (T1, T2, T3=T4) | (1 : 1 : 2) |

(56) References Cited

U.S. PATENT DOCUMENTS

| | | | |
|---|---|---|---|
| 2006/0125761 A1* | 6/2006 | Ahn | G09G 3/3685 |
| | | | 345/98 |
| 2009/0146855 A1* | 6/2009 | Perdoor | H03M 1/0682 |
| | | | 341/143 |
| 2009/0295767 A1* | 12/2009 | Tsuchi | H03M 1/661 |
| | | | 345/204 |
| 2017/0249894 A1* | 8/2017 | Tsuchi | G11C 19/00 |

* cited by examiner

| N: Number of output terminals of decoder circuit | X: Number of input terminals of amplification circuit | Weighting ratio |
|---|---|---|
| 2 : (P1, P2) | 2 : (T1, T2) | (1:1) |
| 3 : (P1, P2, P3) | 4 : (T1, T2, T3=T4) | (1:1:2) |

FIG. 1B

| Device | | First selection state | Second selection state |
|---|---|---|---|
| Amplification circuit 30 | T1–Tm | Multiple reference voltages | Multiple reference voltages |
| | Tm+1–Tx | V0 | |
| | FB | | V0 |
| Output of selector 40 | | V0 | Voltages selected and output by decoder 20 |
| Driving speed control circuit 50 | | Active | Inactive |

| level | Vref | V(T1) | V(T2) | D3 | D2 | D1 | D0 |
|---|---|---|---|---|---|---|---|
| 0 | Vr0 | Vr0 | Vr0 | 0 | 0 | 0 | 0 |
| 1 |  | Vr0 | Vr1 | 0 | 0 | 0 | 1 |
| 2 | Vr1 | Vr1 | Vr1 | 0 | 0 | 1 | 1 |
| 3 |  | Vr2 | Vr2 | 0 | 0 | 1 | 0 |
| 4 | Vr2 | Vr2 | Vr2 | 0 | 1 | 1 | 0 |
| 5 |  | Vr3 | Vr3 | 0 | 1 | 1 | 1 |
| 6 | Vr3 | Vr3 | Vr3 | 0 | 1 | 0 | 1 |
| 7 |  | Vr4 | Vr4 | 0 | 1 | 0 | 0 |
| 8 | Vr4 | Vr4 | Vr4 | 1 | 1 | 0 | 0 |
| 9 |  | Vr5 | Vr5 | 1 | 1 | 0 | 1 |
| 10 | Vr5 | Vr5 | Vr5 | 1 | 1 | 1 | 1 |
| 11 |  | Vr6 | Vr6 | 1 | 1 | 1 | 0 |
| 12 | Vr6 | Vr6 | Vr6 | 1 | 0 | 1 | 0 |
| 13 |  | Vr7 | Vr7 | 1 | 0 | 1 | 1 |
| 14 | Vr7 | Vr7 | Vr7 | 1 | 0 | 0 | 1 |
| 15 |  | Vr7 | Vr8 | 1 | 0 | 0 | 1 |

| level | Vref | V(T1) | V(T2) | V(T3) | V(T4) | D4 | D3 | D2 | D1 | D0 |
|---|---|---|---|---|---|---|---|---|---|---|
| 0 | Vr0 | Vr0 | Vr0 | Vr0 | Vr0 | 0 | 0 | 0 | 0 | 0 |
| 1 |  | Vr0 | Vr0 | Vr0 | Vr0 | 0 | 0 | 0 | 0 | 1 |
| 2 |  | Vr0 | Vr1 | Vr1 | Vr1 | 0 | 0 | 0 | 1 | 0 |
| 3 |  | Vr1 | Vr1 | Vr1 | Vr1 | 0 | 0 | 0 | 1 | 1 |
| 4 | Vr1 | Vr1 | Vr1 | Vr1 | Vr1 | 0 | 0 | 0 | 0 | 0 |
| 5 |  | Vr1 | Vr1 | Vr2 | Vr2 | 0 | 0 | 1 | 0 | 1 |
| 6 |  | Vr2 | Vr2 | Vr2 | Vr2 | 0 | 0 | 1 | 1 | 1 |
| 7 |  | Vr2 | Vr2 | Vr2 | Vr2 | 0 | 0 | 1 | 1 | 0 |
| 8 | Vr2 | Vr2 | Vr3 | Vr3 | Vr3 | 0 | 1 | 1 | 0 | 0 |
| 9 |  | Vr3 | Vr3 | Vr3 | Vr3 | 0 | 1 | 1 | 0 | 1 |
| 10 |  | Vr3 | Vr3 | Vr3 | Vr3 | 0 | 1 | 1 | 1 | 1 |
| 11 |  | Vr3 | Vr4 | Vr4 | Vr4 | 0 | 1 | 1 | 1 | 0 |
| 12 | Vr3 | Vr4 | Vr4 | Vr4 | Vr4 | 0 | 1 | 0 | 1 | 0 |
| 13 |  | Vr4 | Vr4 | Vr4 | Vr4 | 0 | 1 | 0 | 1 | 1 |
| 14 |  | Vr4 | Vr4 | Vr5 | Vr5 | 0 | 1 | 0 | 0 | 1 |
| 15 |  | Vr4 | Vr5 | Vr5 | Vr5 | 0 | 1 | 0 | 0 | 0 |
| 16 | Vr4 | Vr5 | Vr5 | Vr5 | Vr5 | 1 | 1 | 0 | 0 | 0 |
| 17 |  | Vr5 | Vr5 | Vr5 | Vr5 | 1 | 1 | 0 | 0 | 1 |
| 18 |  | Vr5 | Vr5 | Vr6 | Vr6 | 1 | 1 | 0 | 1 | 1 |
| 19 |  | Vr5 | Vr6 | Vr6 | Vr6 | 1 | 1 | 0 | 1 | 0 |
| 20 | Vr5 | Vr6 | Vr6 | Vr6 | Vr6 | 1 | 1 | 1 | 1 | 0 |
| 21 |  | Vr6 | Vr6 | Vr6 | Vr6 | 1 | 1 | 1 | 1 | 1 |
| 22 |  | Vr6 | Vr6 | Vr6 | Vr6 | 1 | 0 | 1 | 0 | 1 |
| 23 |  | Vr6 | Vr6 | Vr6 | Vr6 | 1 | 0 | 1 | 1 | 1 |
| 24 | Vr6 | Vr6 | Vr6 | Vr6 | Vr6 | 1 | 1 | 0 | 0 | 0 |

...

| Device | | First selection state Tc1 | Second selection state Tc2 |
|---|---|---|---|
| Amplification circuit 30 | T1, T3 | Vrk, Vr (k+1) | [Vrk, Vr (k+1)] |
| | T2, T4 | V0 (= (Vrk+Vr (k+1) /2) | |
| Driving speed control circuit 50 | | Active | Inactive |

DIGITAL-TO-ANALOG CONVERSION CIRCUIT, DATA DRIVER, AND DISPLAY DEVICE

CROSS-REFERENCE TO RELATED APPLICATION

This application claims the priority benefit of Japan application serial no. 2020-130512, filed on Jul. 31, 2020. The entirety of the above-mentioned patent application is hereby incorporated by reference herein and made a part of this specification.

BACKGROUND

Technical Field

The disclosure relates to a digital-to-analog conversion circuit, a data driver including the digital-to-analog conversion circuit, and a display device.

Description of Related Art

Currently, as an active matrix type display device, a liquid crystal display device, an organic EL display device, or the like has become the mainstream. In such a display device, a display panel in which multiple data lines and multiple scan lines are arranged interleavingly and display cells connected with the data lines via pixel switches are arranged into a matrix, a data driver supplying analog voltage signals corresponding to gradation levels to the data lines of the display panel, and a scan driver supplying scan signals controlling ON/OFF of the respective pixel switches to the scan lines of the display panel are mounted. The data driver includes a digital-to-analog conversion circuit that converts a video digital signal into an analog voltage corresponding to the brightness level and supplies the amplified voltage signal to each data line of the display panel.

The schematic configuration of the data driver is described in the following.

The data driver includes, for example, a shift register, a data register latch, a level shifter, and a digital-to-analog (DA) conversion part.

The shift register generates multiple latch timing signals for performing latch selection in synchronization with a clock signal in correspondence with a start pulse supplied from a display controller and supplies the latch timing signals to the data register latch. The data register latch, based on each latch timing signal supplied from the shift register, captures, for example, every predetermined number n (n being an integer of 2 or more) video digital data supplied from the display controller and supplies n video digital data signals representing respective video digital data to the level shifter. The level shifter applies a level shift process which increases the signal amplitude to each of the n video digital data signals supplied from the data register latch to obtain n level-shifted video digital data signals and supplies the n level-shifted video digital data signals to the DA conversion part.

The DA conversion part includes a reference voltage generation circuit, a decoder part, and an amplification part.

The reference voltage generation circuit generates multiple reference voltages whose voltage values are different from each other and supplies the reference voltages to the decoder part. For example, the reference voltage generation circuit supplies, as a reference voltage group, multiple divided voltages divided by a ladder resistor between a power voltage and a standard voltage to the decoder. The digital-to-analog conversion which uses multiple reference voltages generated by using such a ladder resistor is referred to as an RDAC method.

The decoder part has n decoder circuits provided in correspondence with the respective outputs of the data driver. Each of the decoder circuits receives the video digital data signal from the level shifter, selects a reference voltage corresponding to the video digital data signal from the reference voltages, and supplies the selected reference voltage to the amplification part.

The amplification part has n amplification circuits individually amplifying the reference voltages selected by the respective decoders of the decoder part and outputting the amplified voltages.

In the DA conversion part, as the number of the reference voltages generated by the reference voltage generation circuit increases, the number of gradations (colors) of the brightness level which can be presented can be increased. However, when the number of the reference voltages generated by the reference voltage generation circuit increases, the chip size (manufacturing cost) of the data driver increases correspondingly.

Therefore, a digital-to-analog conversion circuit in which, as the amplification circuit, an operational amplifier generating voltages between input voltages adjacent to each other by weighting and averaging (also referred to as weighted averaging) multiple input voltages, i.e., performing the so-called interpolation operation, has been proposed (see, for example, Japanese laid-open no. 2000-183747, Japanese laid-open no. 2002-43944, and Japanese laid-open no. 2009-284310).

According to such amplification circuit (also referred to as interpolation amplifier) performing the interpolation operation, through the interpolation operation based on multiple input voltages, voltage values in a number of gradations greater than the number of voltage values which can be expressed by the input voltages can be obtained. Accordingly, even if the total number of reference voltages generated by the reference voltage generation circuit is reduced, it is still possible to generate voltages with a desired number of gradations.

In the following, an amplification circuit included in the digital-to-analog conversion circuit is described with reference to FIG. 1A and FIG. 1B.

FIG. 1A is a circuit diagram illustrating an example of the configuration of the amplification circuit. The amplification circuit shown in FIG. 1A receives x (x being an integer of 2 or more) input voltages V1 to Vx and generates and output weighted average voltages of the input voltages V1 to Vx by applying an interpolation operation to the input voltages V1 to Vx.

The amplification circuit has x non-inverting input terminals T1 to Tx for receiving the input voltages V1 to Vx, a single inverting input terminal, an output terminal Sk, x differential stage circuits 29_1 to 29_x of the same conductivity type, a current mirror circuit 28, and an amplification stage circuit 26.

The differential stage circuit 29_x has a differential pair consisting of N-channel transistors 21_x and 22_x and a current source 23_x driving the differential pair. The current source 23_x is provided between the differential pair and a power terminal VSS. The respective configurations of other differential stage circuits 29_1 to 29_(x−1) are the same as the configuration of the differential stage circuit 29_x. The gate of the transistor (e.g., the transistors 21_1 to 21_x) of one of each differential pair forms a non-inverting input terminal (e.g., the non-inverting input terminals T1 to Tx) of the amplification circuit. The gate of the transistor (e.g., the transistors 22_1 to 22_x) of the other of each differential pair forms the inverting input terminal of the amplification circuit.

The inverting input terminal of the amplification circuit is connected to the output terminal Sk, and forms a voltage-follower type feedback amplification circuit. The output terminal of one of the differential pair of each of the differential stage circuits 29_1 to 29_x is commonly connected to a node n21, and the output terminal of the other of the differential pair of each of the differential stage circuits 29_1 to 29_x is commonly connected to a node n22.

The current mirror circuit 28 has P-channel transistors 24 and 25, and is provided between a power terminal VDD and the node n21 as well as the node n22. The amplification stage circuit 26 at least receives the voltage generated at the node n21 to generate an amplification effect, and amplifies and outputs an output voltage Vout from the output terminal Sk. At this time, the voltage value of the output voltage Vout is set at a voltage Vexp.

In the following, the relationship between the signal voltages V1 to Vx input to the non-inverting input terminals T1 to Tx of the amplification circuit and the voltage Vexp is described.

The signal voltages V1 to Vx have voltages at levels selected by the decoder circuits in each predetermined data period. The signal voltages V1 to Vx are respectively step signal voltages in which voltage values change in a step-like manner from voltages of the previous data period, and forms a group of x voltages including the same voltage within a very small voltage range with respect to the output dynamic range of the amplification circuit.

When the amplification rate of the amplification circuit is 1, the voltage Vexp is equivalent to the weighted average of the input signal voltages V1 to Vx.

In the following, the operation of the amplification circuit is described by taking an example of the case in which the transistors forming the differential pair of the $j^{th}$ circuit (j being an integer of 1 to x) in the differential stage circuits 29_1 to 29_x are set to be Aj times with respect to a standard size ratio (W/Z ratio) equivalent to a ratio between the channel length L and the channel width W, i.e., the weighting ratio is Aj.

Drain currents Ia_j and Ib_j of the $j^{th}$ differential pair (21_j, 22_j) are represented by using Formula (5) and Formula (6) in the following.

$$Ia\_j = (Aj \cdot \beta/2) \cdot (Vj - VTH)2 \tag{5}$$

$$Ib\_j = (Aj \cdot \beta/2) \cdot (V\exp - VTH)2 \tag{6}$$

β: gain coefficient when the transistor has a standard size ratio of 1
VTH: threshold voltage of the transistor The commonly connected output terminals of the differential stage circuits 29_1 to 29_x are connected to the input (node n22) and the output (node n21), and are controlled so that the output currents of the commonly connected output terminals of the differential stage circuits 29_1 to 29_x are equal. Accordingly, regarding the output currents of the differential stage circuits 29_1 to 29_x, Formula (7) in the following is established.

$$Ia\_1 + Ia\_2 + \ldots + Ia\_x = Ib\_1 + Ib\_2 + \ldots + Ib\_x \tag{7}$$

In Formula (5) and Formula (6), j is expanded in the range of 1 to x and substituted into Formula (7). Here, regarding the first-order term of the threshold voltage VTH, when the two sides are equal, Formula (7) and Formula (8) as follows are derived.

$$A1 \cdot V1 + A2 \cdot V2 + \ldots + Ax \cdot Vx = (A1 + A2 + \ldots + Ax) \times V\exp \tag{8}$$

$$V\exp = (A1 \cdot V1 + \ldots + Ax \cdot Vx)/(A1 + \ldots + Ax) \tag{9}$$

Accordingly, as represented in Formula (9), the amplification circuit outputs, as the output voltage Vout, a value obtained by dividing the sum of the products of the signal voltages input to the respective differential pairs and the weighting ratios (i.e., A1·V1+ . . . +Ax·Vx) by the sum of the weighting ratios (i.e., A1+ . . . +Ax), that is, the voltage Vexp equivalent to the weighted average of the signal voltages V1 to Vx. While FIG. 1A illustrates the configuration of the differential stage circuit including differential pairs of N-channel transistors and the current mirror circuit of P-channel transistors, a configuration of a differential stage circuit including differential pairs of P-channel transistors and a current mirror circuit of N-channel transistors or a configuration of a differential stage circuit including differential pairs of transistors of both conductivity types, i.e., N-channel and P-channel and a current mirror circuit may also be adopted. In either of the configurations, Formula (9) is established.

In the following, a case in which the amplification circuit of FIG. 1A is applied to an output amplification circuit of a decoder circuit included in the data driver is described.

FIG. 1B is a diagram illustrating a corresponding relationship among N output terminals T1 to TN of each decoder circuit, the non-inverting input terminals T1 to Tx of the amplification circuit, and the weighting ratios in the case where the differential stage circuits 29_1 to 29_x are of the same configuration, that is, the weighting ratios of the respective differential stage circuits are configured to be the same.

Here, for example, the case where, as multiple voltages selected based on digital data by using the decoder circuits, two voltages different from each other are supplied to x non-inverting input terminals of the amplification circuit at a predetermined ratio is assumed. At this time, the amplification circuit of FIG. 1A can output multiple voltages, which are x divided voltages between two voltages, based on two voltages VA and VB.

Specifically, for example, in the case where "x" is set at 2, i.e., when the amplification circuit has two non-inverting input terminals T1 and T2, when the combination of the voltages VA and VB different from each other is selected and input, as voltages V(T1) and V(T2), into the non-inverting input terminals T1 and T2 of the amplification circuit, in correspondence with (V(T1), V(T2))=(VA, VA), (VB, VB), (VA, VB), the voltages VA and VB and voltages obtained by dividing the voltages VA and VB into two can be output from the amplification circuit.

In addition, for example, in the case where "x" is set at 4, that is, the non-inverting input terminals of the amplification circuit are set as T1 to T4, and the same voltages are supplied to T3 and T4, when the combination of the voltages VA and VB are selected and input, as voltages V(T1) to V(T4), into the non-inverting input terminals T1 to T4 of the amplification circuit, in correspondence with (V(T1), V(T2), V(T3), V(T4))=(VA, VA, VA, VA), (VB, VB, VB, VB), (VA, VB, VA, VA), (VA, VA, VB, VB), (VA, VB, VB, VB), the voltages VA, VB and voltages obtained by dividing the voltages VA and VB into four, i.e., ((3VA+VB)/4), ((VA+VB)/2), ((VA+3VB)/4), can be output from the amplification circuit. Since T3 and T4 are supplied with the same voltage, assuming that T4 is included in T3, the weighting ratio of the three terminals (T1, T2, T3) can be regarded as (1:1:2).

According to the above, by increasing "x", it is possible to easily expand further.

In addition, while the above describes the case where the differential stage circuits 29_1 to 29_x of FIG. 1A are of the same configuration, it may also be configured that a predetermined weighting ratio is set for each differential stage circuit.

Recently, as the image sizes and the resolutions of display panels increase, the load capacity of data lines of the display panel which the data driver has to drive increases, and a driving period (also referred to as an one-data period) per pixel (display cell) in which the data driver drives a data line tends to be short.

When the load capacity of the data lines increases and the driving period is shortened, in order to ensure a charge rate of a predetermined value or higher over the entire region of the data lines, high-speed driving becomes necessary for the data driver. When the charge rate of the data lines drops below the predetermined value, deteriorated image qualities, such as uneven brightness, may occur.

For example, an one-data period for a 4K display panel at a frame frequency of 120 Hz (number of data lines: 3840×3, number of scan lines: 2160) is about 3.7 us, whereas an one-data period for a 8K display panel, whose resolution is four times of 4K, is as short as 1.85 us. By increasing the operational current to increase the slew rate of the output voltage, the amplification circuit can bring up the speed to a certain level. However, with an one-data period being shortened and the definition of the display panel being increased, the change speed of the input voltage of the amplification circuit cannot be ignored. The change speed of the input voltage of the amplification circuit affects the change speed of the output voltage of the amplification circuit, and a decrease in the charge rate of data lines (eventually the charge rate of an electrode in the display cell) leads to a decreased panel display quality.

Here, as described above, the amplification circuit performing the interpolation operation has multiple input terminals, and there is a case where the parasitic capacitance of the input terminals affects the change speed of the input voltage of the amplification circuit. Details concerning this point are set forth in the following.

For the ease of description, the number of input terminals x of the amplification circuit is set at "4", and the weighting ratios of the respective input terminals are consistently set at 1. In addition, it is configured that the input terminals T3 and T4 are commonly connected and receive the same voltage. At this time, a worst condition which leads to a decreased change speed of the supply voltage to the input terminals of the amplification circuit is the case where the same reference voltage is input to the four input terminals of the amplification circuit. That is, there is a case where one reference voltage selected by the decoder circuit is respectively supplied to the four input terminals of the amplification circuit.

For example, the input voltage of the amplification circuit is a reference voltage VrM in the previous data period, and in the case where the potential difference from the voltage VrM changes toward the large reference voltage Vr0 in the next data period, the change speed depends on the following condition. That is, the change speed depends on the wiring resistance which transmits the reference voltage Vr0 in the decoder circuit and the on-resistance of a select switch and the gate parasitic capacitance (e.g., Cp1 to Cp4 of FIG. 1A) of the four input terminals of the amplification circuit receiving the reference voltage Vr0.

In the worst case where multiple amplification circuits corresponding to all the outputs of the data driver, that is, all the input terminals of the output amplification circuits receive the reference voltage Vr0, the total parasitic capacitance obtained by accumulating the total number of outputs to the gate parasitic capacitance of the four input terminals of each amplification circuit is connected to the reference voltage Vr0, and the speed at which the input voltage of each amplification circuit changes from VrM to Vr0 according to a time constant of impedance decreases. Accordingly, at this time, the issue that the change of the output voltage of the amplification circuit becomes slower arises. As the number x of the input terminals of each amplification circuit increases, the delay of the output voltage change of the amplification circuit also increases.

Meanwhile, there is also the case where different reference voltages are supplied to the input terminals of the amplification circuit, which differs from the case where the same reference voltage is supplied to the input terminals of the amplification circuit. For example, in the case where the amplification circuit outputs voltages of gradation levels between the reference voltage Vr0 and a reference voltage Vr1 adjacent thereto, Vr0 and Vr1 are distributed and supplied to the four input terminals T1 to T4 of the amplification circuit. In such case, the parasitic capacitance corresponding to the number of the input terminals connected to one reference voltage is less than the worst case. Therefore, the issue that the speeds at which the output voltages of the amplification circuits for the respective gradation levels differ may also arise. These issues may lead to a low display quality such as a low brightness or display unevenness.

Therefore, the disclosure provides a digital-to-analog conversion circuit including an amplification circuit performing an interpolation operation, a data driver including the digital-to-analog conversion circuit, and a display device capable of high-speed processing and unification of change speeds of output voltages.

SUMMARY

A digital-to-analog conversion circuit according to an embodiment of the disclosure includes: a reference voltage generation part, generating a reference voltage group having voltage values different from each other; a decoder, receiving a digital data signal, selecting a plurality of reference voltages with overlapping from the reference voltage group based on the digital data signal, and outputting the reference voltages; an amplification circuit, having first to $x^{th}$ input terminals, x being an integer of 2 or more, and outputting, as an output voltage, a voltage amplified by averaging the reference voltages respectively received by the first to $x^{th}$ input terminals with predetermined weighting ratios; and a selector, receiving a control signal specifying a first selection state or a second selection state, and switching voltages supplied to (x-m) input terminals excluding m input terminals, m being an integer of 1 or more and less than x, among the first to $x^{th}$ input terminals of the amplification circuit in correspondence with the first selection state or the second selection state. In a case where the control signal indicates the first selection state, the selector supplies the output voltage to the (x-m) input terminals among the first to $x^{th}$ input terminals of the amplification circuit, and in a case where the control signal indicates the second selection state, the selector supplies the reference voltages to the (x-m) input terminals.

In addition, a data driver according to an embodiment of the disclosure generates, as an output voltage, a voltage having a voltage value corresponding to a brightness level represented in a video data signal and applies the output voltage to the display panel. The data driver includes: a reference voltage generation part, generating a reference voltage group having voltage values different from each other; a decoder, receiving the video data signal, selecting a plurality of reference voltages with overlapping corresponding to the brightness level represented in the video data signal from the reference voltage group, and outputting the reference voltages; an amplification circuit, having first to $x^{th}$ input terminals, x being an integer of 2 or more, and generating, as an output voltage, a voltage amplified by averaging the reference voltages respectively received by the first to $x^{th}$ input terminals with predetermined weighting ratios; and a selector, receiving a control signal specifying a first selection state or a second selection state, and switching voltages supplied to (x-m) input terminals excluding m input terminals, m being an integer of 1 or more and less than x, among the first to $x^{th}$ input terminals of the amplification circuit in correspondence with the first selection state or the second selection state. In a case where the control signal indicates the first selection state, the selector supplies the output voltage to the (x-m) input terminals among the first to $x^{th}$ input terminals of the amplification circuit, and in a case where the control signal indicates the second selection state, the selector supplies the reference voltages to the (x-m) input terminals.

In addition, a display device according to an embodiment of the disclosure includes a display panel and a data driver, generating, as an output voltage, a voltage having a voltage value corresponding to a brightness level represented in a video data signal and applying the output voltage to the display panel. The data driver includes: a reference voltage generation part, generating a reference voltage group having voltage values different from each other; a decoder, receiving the video data signal, selecting a plurality of reference voltages with overlapping and corresponding to the brightness level represented in the video data signal from the reference voltage group, and outputting the reference voltages; an amplification circuit, having first to $x^{th}$ input terminals, x being an integer of 2 or more, and generating, as an output voltage, the reference voltages amplified by averaging the reference voltages respectively received by the first to $x^{th}$ input terminals with predetermined weighting ratios; and a selector, receiving a control signal specifying a first selection state or a second selection state, and switching voltages supplied to (x-m) input terminals excluding m input terminals, m being an integer of 1 or more and less than x, among the first to $x^{th}$ input terminals of the amplification circuit in correspondence with the first selection state or the second selection state. In a case where the control signal indicates the first selection state, the selector supplies the output voltage to the (x-m) input terminals among the first to $x^{th}$ input terminals of the amplification circuit, and in a case where the control signal indicates the second selection state, the selector supplies the reference voltages to the (x-m) input terminals.

BRIEF DESCRIPTION OF THE DRAWINGS

FIG. 1B is a diagram illustrating an example of output terminals of a decoder circuit, input terminals of an amplification circuit, and a weighting ratio of each input terminal.

FIG. 5 is a diagram illustrating an example of input/output states of each of an amplification circuit 30, a selector 40, and a driving speed control circuit 50 under a first selection state and a second selection state.

FIG. 7A is a diagram illustrating an example of a favorable specification in the case where the number "x" of input terminals of the amplification circuit 30 is set at two.

FIG. 7B is a diagram illustrating an example of a favorable specification in the case where the number "x" of the input terminals of the amplification circuit 30 is set at four.

DESCRIPTION OF THE EMBODIMENTS

Figure 1A:
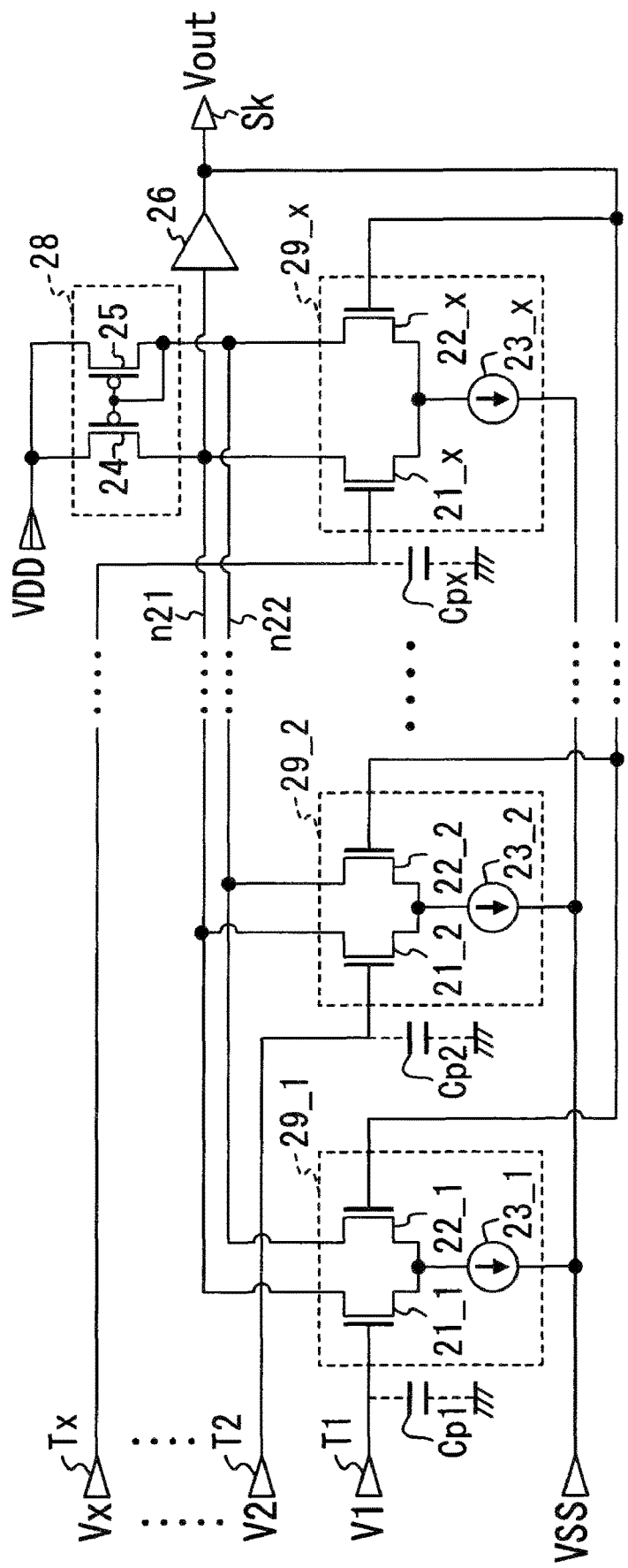
FIG. 1A is a circuit diagram illustrating a configuration of an amplification circuit performing an interpolation operation.

According to the disclosure, as the amplification circuit of the digital-to-analog conversion circuit receiving multiple voltages and performing an interpolation operation on the voltages, an amplification circuit as described below which is set to one of the first selection state and the second selection state in correspondence with the control signal and in which the selection states are switchable is adopted.

Here, at the time when the amplification circuit is set to the first selection state, the m (m being an integer of 1 or more and less than x) input terminals among the first to $x^{th}$ (x being an integer of 2 or more) input terminals respectively receive the reference voltages with overlapping selected by the decoder based on the digital data signal and the remaining (x-m) input terminals receive the output voltage of the amplification circuit itself. Then, the amplification circuit outputs, as the output voltage, a voltage amplified by averaging the multiple reference voltages respectively received by the m input terminals with the weighting ratios set for the respective m input terminals.

Meanwhile, at the time when the amplification circuit is set to the second selection state, the first to $x^{th}$ input terminals of the amplification circuit receive the reference voltages with overlapping selected by the decoder. Then, the amplification circuit outputs, as the output voltage, the voltage amplified by averaging the multiple reference voltages respectively received at the first to $x^{th}$ input terminals with the weighting ratios set for the respective first to $x^{th}$ input terminals.

Accordingly, in the first selection state, the number (of parasitic capacitance) of the input terminals of the amplification circuit connected to the wire of one reference voltage is less than the number of the worst case. At this time, in each amplification circuit, the number of input terminals connected to the wire of one reference voltage can be set to 1 at minimum. In addition, the output voltage output by the amplification circuit in correspondence with the voltage of the input terminals connected to the wire of the reference voltage is supplied to the input terminals of the amplification circuit not connected to the wire of the reference voltage.

In the second selection state, the reference voltages selected by the decoder based on the digital data signal are assigned to the respective input terminals of the amplification circuit. At this time, the input terminals of the amplification circuit supplied with the output voltage of the amplification circuit itself in the first selection state are respectively connected to the wires of the reference voltages of the decoder in the second selection state. Therefore, since the parasitic capacitance parasiting these input terminals is charged or discharged by the output voltage of the amplification circuit 30 itself until the voltage is sufficiently close to the voltages of the wires connected to the reference voltages in the first selection state, the voltage may quickly reach a voltage at a predetermined gradation level and becomes stable in the second selection state.

Therefore, compared with the case of the conventional digital-to-analog conversion circuit in which one selection voltage is supplied to all the input terminals of the amplification circuit, the disclosure is capable of reducing the delay time resulting from the parasitic capacitance at the input part of the amplification circuit, regardless of the contents of the digital data signal. Accordingly, the processing time of the digital-to-analog conversion circuit can be reduced. Moreover, the delay of the change speed of the output voltage of the amplification circuit in the worst case can be alleviated, and the change speeds of the output voltages of the amplification circuits for respective gradation levels can be unified. Therefore, according to the data driver in which the digital-to-analog circuit including the amplification circuit is mounted, the display quality of high-definition images can be improved.

Figure 2:
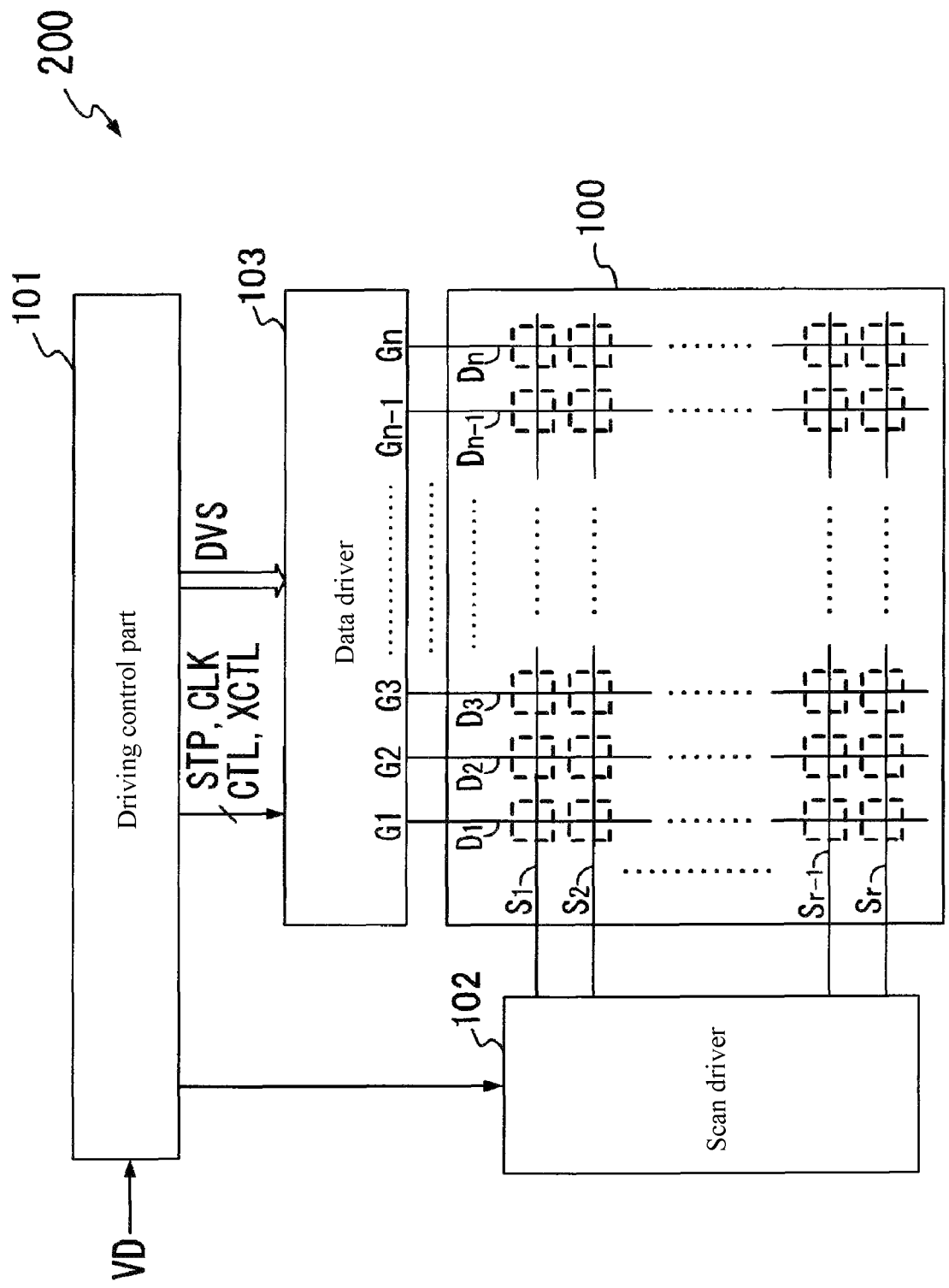
FIG. 2 is a block diagram illustrating a schematic configuration of a display device 200 including a digital-to-analog conversion circuit according to the disclosure.

FIG. 2 is a block diagram illustrating a schematic configuration of a display device 200 including a digital-to-analog conversion circuit and a data driver according to the disclosure.

As shown in FIG. 2, the display device 200 includes a display panel 100, a driving control part 101, a scan driver 102, and a data driver 103.

The display panel 100 is, for example, formed by a liquid crystal panel or an organic EL panel, and has r (r being a natural number of two or more) scan lines S1 to Sr extending along the horizontal direction of a two-dimensional screen and n (n being a natural number of two or more) data lines D1 to Dn extending along the vertical direction of the two-dimensional screen. A display cell that bears a pixel is formed at each of the intersections of the horizontal scan lines and the data lines.

The driving control part 101 supplies a scan timing signal which generates a horizontal scan pulse supplied to each scan line to the scan driver 102.

In addition, the driving control part 101 generates and supplies various control signals, including a start pulse signal STP, a clock signal CLK, control signals CTL and XCTL, and a video digital signal DVS to the data driver 103 based on a video signal VD.

The scan driver 102 sequentially applies the horizontal scan pulse to each of the horizontal scan lines S1 to Sr of the display panel 100 in correspondence with the scan timing signal supplied from the driving control part 101.

The data driver 103 captures a series of image data PD included in the video digital signal DVS and individually representing the brightness level of each pixel in 8 bits, for example, in correspondence with the various control signals (STP, CLK, CTL, XCTL) supplied from the driving control part 101. In addition, the number of bits of the video data PD is not limited to 8 bits. In addition, the data driver 103 converts the captured video data PD into n driving voltages G1 to Gn having voltage values with amplitudes corresponding to brightness levels represented by each video data PD for each horizontal scan line (n voltages per line).

Figure 3:
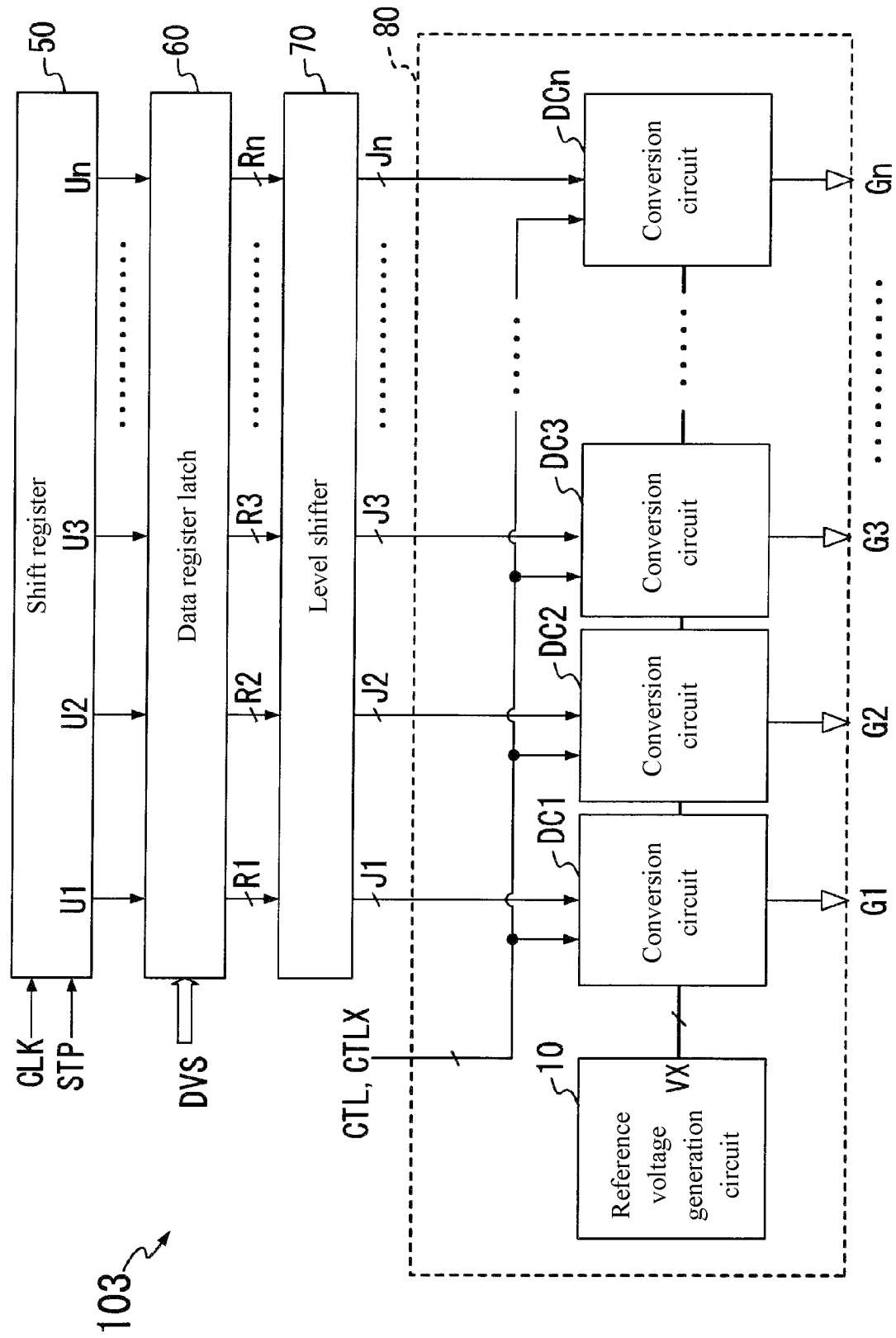
FIG. 3 is a block diagram illustrating an internal configuration of a data driver 103.

FIG. 3 is a block diagram illustrating an internal configuration of the data driver 103.

As shown in FIG. 3, the data driver 103 includes a shift register 50, a data register latch 60, a level shifter 70, and a digital-to-analog (DA) conversion part 80.

The shift register 50 generates latch timing signals U1 to Un for performing latch selection in synchronization with the clock signal CLK in correspondence with the start pulse STP supplied from the driving control part 101, and supplies the latch timing signals U1 to Un to the data register latch 60.

The data register latch 60 sequentially captures the video data PD supplied from the driving control part 101 based on the latch timing signals U1 to Un and supplies video data signals R1 to Rn representing each video data PD to the level shifter 70 for each horizontal scan line (n signals per line).

The level shifter 70 supplies n video data signals J1 to Jn to the DA conversion part 80. The n video data signals J1 to Jn are obtained by applying a level shift process increasing a signal level of the signal to each of the video data signals R1 to Rn.

The DA conversion part 80 receives the respective video data signals J1 to Jn as digital data signals, respectively converts the digital data signals into the driving voltages G1 to Gn having analog voltage values based on the control signals CTL and CTLX.

The DA conversion part 80, as shown in FIG. 3, includes a reference voltage generation circuit 10 and conversion circuits DC1 to DCn.

The reference voltage generation circuit 10 generates a reference voltage group VX consisting of multiple reference voltages whose voltage values are respectively different, and supplies the reference voltage group VX to the respective conversion circuits DC1 to DCn.

The respective conversion circuits DC1 to DCn respectively and individually receive the video data signals J1 to Jn. For each of the video data signals J1 to Jn, the corresponding conversion circuit selects a reference voltage having a voltage value corresponding to the video data signal from the reference voltage group VX based on the control signals CTL and CTLX. Then, the respective conversion circuits DC1 to DCn output the selected reference voltages as the driving voltages G1 to Gn. As shown in FIG. 3, the conversion circuits DC1 to DCn are provided respectively in correspondence with the video data signals J1 to Jn, and have internal configurations same as one another.

Embodiment 1

Figure 4:
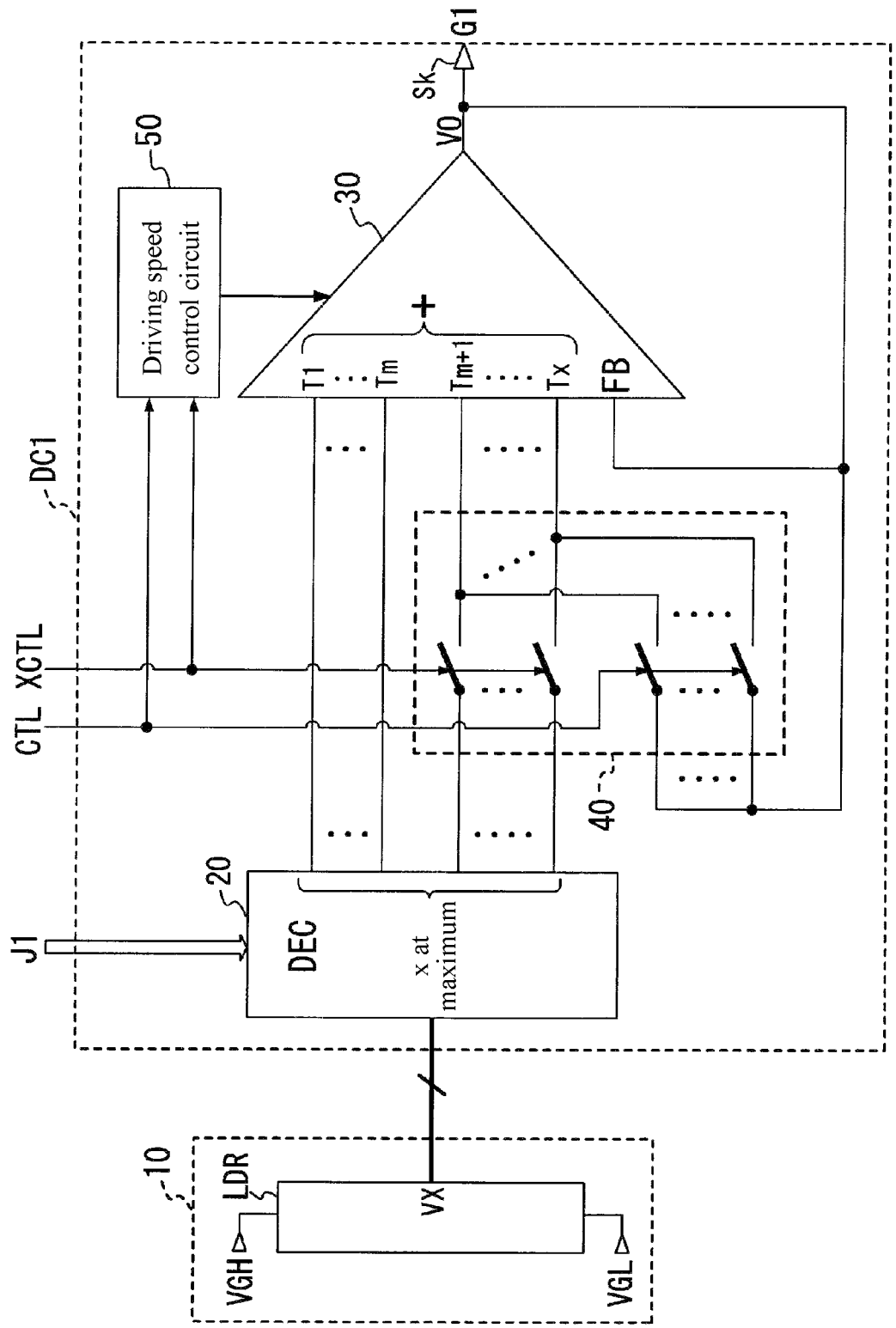
FIG. 4 is a block diagram illustrating an example of an internal configuration of a reference voltage generation circuit 10 and a conversion circuit DC1 as a digital-to-analog conversion circuit.

FIG. 4 is a block diagram illustrating an example of an internal configuration of the reference voltage generation circuit 10 and the conversion circuit DC1 as a digital-to-analog conversion circuit by taking any one of the conversion circuits DC1 to DCn shown in FIG. 3, such as DC1, as an example. FIG. 4 is an example of a digital-to-analog conversion circuit for each output of the data driver.

The reference voltage generation circuit 10, for example, receives a predetermined potential VGH and a potential VGL lower than the potential VGH, and includes a ladder resistor LDR which divides a voltage (VGH-VGL) between the potential VGH and the potential VGL into multiple voltages whose voltage values are different. The reference voltage generation circuit 10 sets the multiple voltages divided by the ladder resistor LDR as the reference voltage group VX and supplies the reference voltage group VX to each of the conversion circuits DC1 to DCn.

The conversion circuit DC1 includes a decoder 20, an amplification circuit 30, a selector 40, and a driving speed control circuit 50.

The decoder 20 receives the reference voltage group VX and the video digital data signal J1 consisting of 8 bits, for example, and selects and outputs multiple reference voltages with overlapping, whose number is x (x being an integer of 2 or more) at maximum, in correspondence with the video digital data signal J1 from the reference voltage group. The multiple reference voltages selected by the decoder 20 may be a combination of reference voltages adjacent to each other (referred to as "adjacent reference voltages" in the following) or reference voltages with a small difference in voltage value.

The amplification circuit 30 consists of a differential amplifier, also referred to as an operational amplifier, including first to $x^{th}$ (x being an integer of 2 or more) input terminals T1 to Tx as non-inverting input terminals and an inverting input terminal FB. The amplification circuit 30 can be configured as the same circuit as the amplification circuit shown in FIG. 1A.

The amplification circuit 30 has a feedback configuration in which an output voltage VO output by the amplification circuit 30 itself is input to the inverting input terminal FB of the amplification circuit 30 itself. The first to $x^{th}$ input terminals (T1 to Tx) are classified into m (m being an integer where $1 \leq m < x$) input terminals and remaining (x-m) input terminals.

The amplification circuit 30 averages the multiple reference voltages with overlapping received at the input terminals T1 to Tx with weighting ratios set in advance at the respective terminals T1 to Tx and outputs an amplified voltage as the output voltage VO. At this time, the amplification circuit 30 included in the conversion circuit DC1 outputs the output voltage VO, as the driving voltage G1, via an output terminal Sk.

The selector 40 and the driving speed control circuit 50 respectively receive the control signals (CTL, XCTL). The control signals (CTL, XCTL) are control signals instructing setting to one of a first selection state and a second selection state.

Based on the control signals (CTL, XCTL), the selector 40 switches between supplying the multiple reference voltages selected by the decoder 20 or supplying the output voltage VO to the (x-m) input terminals, such as the input terminals TM+1 to Tx, of the amplification circuit 30. That is, in the case where the control signal indicates the first selection state, the selector 40 supplies the output voltage VO to (x-m) input terminals excluding m input terminals among the first to $x^{th}$ input terminals of the amplification circuit 30. Meanwhile, in the case where the control signal indicates the second selection state, the selector 40 supplies the multiple reference voltages selected by the decoder 20 to the (x-m) input terminals.

Based on the control signals (CTL, XCTL), the driving speed control circuit 50 is linked with the state of the selector 40 and set to an active state (operation state) which performs driving speed control on the amplification circuit 30 or set to an inactive state (stop state). The driving speed control circuit 50 has a function of keeping the driving speed of the amplification circuit 30 constant.

In the following, the operations of the amplification circuit 30, the selector 40, and the driving speed control circuit 50 shown in FIG. 4 are described.

The number of input terminals of the amplification circuit 30 is represented as "x". In addition, "m" is defined as $1 \leq m < x$ and $x \geq 2$. In addition, as shown in FIG. 4, regardless of the first selection state and the second selection state, the output voltage VO of the amplification circuit 30 itself is fed back and input to the inverting input terminal FB of the amplification circuit 30.

FIG. 5 is a diagram illustrating the input/output states of the amplification circuit 30, the selector 40, and the driving speed control circuit 50 in the first selection state and the second selection state switched and controlled by the control signals (CTL, XCTL).

In the first selection state, the switch group receiving the control signal CTL in the selector 40 is in the ON state, and the switch group receiving the control signal XCTL in the selector 40 is in the OFF state. In addition, in the first selection state, the driving speed control circuit 50 is set to the active state (operation state).

Meanwhile, in the second selection state, the switch group receiving the control signal CTL in the selector 40 is in the OFF state, and the switch group receiving the control signal XCTL in the selector 40 is in the ON state. Moreover, the driving speed control circuit 50 is set to the inactive state (stop state).

Accordingly, as shown in FIG. 5, in the first selection state, the m input terminals (T1 to Tm) of the amplification circuit 30 are supplied with the multiple reference voltages with overlapping selected to be output by the decoder 20, and the remaining (x-m) input terminals (Tm+1 to Tx) are supplied with the output terminal VO of the amplification circuit 30. At this time, the amplification circuit 30 outputs, as the output voltage VO, the voltage amplified by averaging the multiple reference voltages received at the m input terminals with the weighting ratios set for the respective m input terminals.

In the first selection state, since the differential pairs including the (x-m) input terminals (Tm+1 to Tx) are supplied with the output voltage VO to both the non-inverting input terminals and the inverting input terminal, the differential pairs do not contribute to the driving ability of the amplification circuit.

Since the driving speed of the amplification circuit 30 is kept constant regardless of the first or second selection state, the driving speed control circuit 50 is activated in the first state and increases the driving ability of the differential pairs including the m input terminals (T1 to Tm) receiving the multiple reference voltages. The driving speed control circuit 50, for example, may also include a current increasing means which increases the driving current during the first selection state only to some or all of the current sources driving the differential pairs including the m input terminals (T1 to Tm). In the current increasing means, the total of the current values of the m current sources driving the m differential pairs in the first selection state may be set to be equal to the total of the current values of the x current sources driving the x differential pairs in the second selection state.

Meanwhile, in the second selection state, the m input terminals and the (x-m) input terminals of the amplification circuit 30 together are supplied with the multiple reference voltages with overlapping which are selected and output by the decoder 20. Moreover, in the second selection state, the driving speed control circuit 50 is inactivated. At this time, the amplification circuit 30 outputs, as the output voltage VO, the voltage amplified by averaging the multiple reference voltages supplied to the first to $x^{th}$ input terminals T1 to Tx with the weighting ratios set for the respective input terminals T1 to Tx. That is, the operation of the amplification circuit 30 in the second selection state is the same as the conventional operation.

In the embodiment, in the worst case in which the x input terminals of the amplification circuit for each output are all connected with the wire of one reference voltage, since the parasitic capacitance of the input terminals of the amplification circuit 30 connected with the wire of one reference voltage is less than the conventional parasitic capacitance, the change speed of the input voltage of the amplification circuit can be increased.

In the embodiment, the total of the weighting ratios respectively set for the m input terminals may be set to be less than or equal to ½ of the total of the weighting ratios respectively set for the first to $x^{th}$ input terminals. Alternatively, the number "m" of the input terminals receiving the signal selected by the decoder 20 in the first selection state may be set to be a positive number that is ½ or less than the number "x" of all the input terminals receiving the signals selected by the decoder 20 in the second selection state. For example, in the first selection state, the number of the input terminals of the amplification circuit connected to the wire of one reference voltage can be set to 1 at minimum. In the case where the numbers of input terminals of the amplification circuits connected to the wire of one reference voltage are constant, the change speeds of the input voltages of the amplification circuit 30 in the first selection state are unified without dependency on the gradation levels.

In addition, while the (x-m) input terminals (Tm+1 to Tx) of the amplification circuit 30 change from the output voltage VO to the multiple reference voltages selected by the decoder 20 at the time of switching from the first selection state to the second selection state, the voltage change at this time is within a voltage range of the adjacent reference voltage or within a voltage range where the difference in voltage value is sufficiently small. Therefore, the voltages of the (x-m) input terminals quickly become stable after the switching to the second selection state.

According to the above, through the control of the first selection state and the second selection state shown in FIG. 5, the voltage changes of the respective input terminals of the amplification circuit 30 can be fast, and a voltage change speed independent from the selected gradations can be realized.

Figure 6:
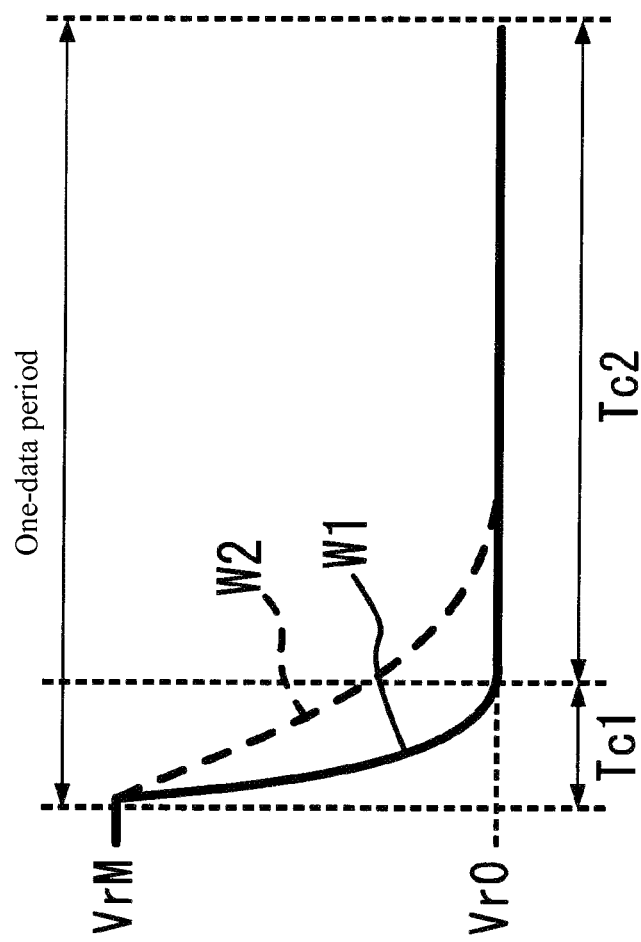
FIG. 6 is a diagram illustrating an example of an input voltage waveform of an input terminal of the amplification circuit 30 within a one-data period.

FIG. 6 is a diagram illustrating an example of an input voltage waveform of the input terminal of the amplification circuit 30 within a one-data period. FIG. 6 illustrates, as the one-data period, a period from the decoder 20 receiving the video data signal of one pixel until the decoder 20 receiving the video data signal of the next pixel.

As shown in FIG. 6, the one-data period includes a first period Tc1 and a second period Tc2 following the first period Tc1. With the control circuits (CTL, XCTL), the amplification circuit 30, the selector 40, and the driving speed control circuit 50 are set to the first selection state in the first period Tc1 and set to the second selection state in the second period Tc2.

In FIG. 6, a solid waveform W1 in the period Tc1 represents a voltage waveform when the m input terminals of the amplification circuit 30 receive the multiple reference voltages in the first selection state. A dashed waveform W2 represents a voltage waveform when the x input terminals of the amplification circuit 30 receive the multiple reference voltages in the case where the second selection state is maintained during the one-data period as in the conventional amplification circuit. In addition, FIG. 6 assumes the worst case in which all the n outputs of the data driver perform the same operation during the one-data period in which the selection voltage of the decoder is switched from the reference voltage VrM with a large potential difference to the reference Vr0.

The dashed waveform W2 changes from the reference voltage VrM selected by the decoder 20 in the previous one-data period to the reference voltage Vr0 within the one-data period. At this time, conventionally, the reference voltage Vr0 is selected by the decoder 20 and supplied to all the x input terminals T1 to Tx of the amplification circuit 30 for each output during the one-data period.

Regarding the speed of the voltage change of the dashed waveform W2, the total of the parasitic capacitance (parasitic capacitance of the transistors of the differential pairs) of the input terminals T1 to Tx of the amplification circuit 30 for each output becomes a load with respect to the wire of the reference voltage Vr0, and the speed depends on a time constant combining the resistance and the capacitance of the wire transmitting the reference voltage Vr0 and the impedance of the decoder itself.

In the embodiment, in the first period Tc1 immediately after the beginning of the one-data period, the first selection state is set, and the reference voltage Vr0 is supplied to m of the input terminals T1 to Tx of the amplification circuit 30. By setting a small number (1 at minimum) for the terminal number m supplied with the reference voltage Vr0, the total of the parasitic capacitance of the m input terminals of the amplification circuit 30 as the load of the wire of the reference voltage Vr0 is reduced.

Accordingly, as shown in FIG. 6, the voltage change represented by the solid waveform W1 is faster than the speed of the dashed waveform W2. In the case where the numbers "m" of the input terminals are constant, the voltage change speeds of the m input terminals in the first selection state are unified and independent from the gradation levels.

During the first period Tel, the output voltage VO is supplied to the (x-m) input terminals of the amplification circuit 30. Here, the output voltage VO is a voltage corresponding to the reference voltage Vr0 supplied to the m input terminals and is a voltage equal or sufficiently close to the reference voltage Vr0.

In the first period Tel, by activating the driving speed control circuit 50, the driving speed of the amplification circuit 30 is controlled so as to be kept constant during the one-data period.

In the second period Tc2, the second selection state is set, and the reference voltage Vr0 is supplied to the input terminals T1 to Tx of the amplification circuit 30. At this time, the (x-m) input terminals are supplied with the output voltage VO (≈Vr0) in the first period Tel, and is switched to be supplied with the reference voltage Vr0 in the second period Tc2. However, since the potential difference is small, the switching is quick and stable.

According to the above, in the embodiment, the changes of the input voltages of the amplification circuit 30 can be accelerated, and the change speed of the output voltage of the amplification circuit 30 can be correspondingly increased. By exerting the control suitable for the disclosure and the same to all gradation levels, the change speeds of the output voltages of the amplification circuits 30 for the respective gradation levels can be aligned.

In the following, an example of the specification of the decoder suitable for the embodiment is described.

FIGS. 7A and 7B are diagrams illustrating an example of the operation of the decoder 20 as a favorable specification of the DA conversion circuit (10, DC1) according to the embodiment.

FIG. 7A is a diagram illustrating a favorable specification in the case where the number "x" of the input terminals of the amplification circuit 30 is set at two, and FIG. 7B is a diagram illustrating a favorable specification in the case where the number "x" of the input terminals of the amplification circuit 30 is set at four. In addition, in FIGS. 7A and 7B, the relationship among the reference voltage Vref selected by the decoder 20, the bit codes of the data signal (bit D3 to D0 and D4 to D0) and the supply voltages [V(T1) to V(Tx)] to the input terminals T1 to Tx of the amplification circuit 30 is shown in association with the gradation levels representing the voltage values of the output voltage in a stepwise manner. The voltages [V(T1) to V(Tx)] illustrate the relationship with the reference voltage Vref selected by the decoder 20 based on digital data.

In the specification of FIG. 7A, the reference voltages Vr0, Vr1, Vr2, . . . , are set, as the reference voltage group, for every two levels with respect to the input terminals T1 and T2. The decoder 20 selects, as selection voltages V(T1) and V(T2) supplied to the input terminals T1 and T2 of the amplification circuit 30 during the one-data period, for example, the same reference voltage (Vrk, Vrk) for an even-number level (2k, k being an integer of 0 or more) and adjacent reference voltages (Vrk, Vr(k+1)) for an odd-number level (2k+1). When the weighting ratio of the input terminals T1 and T2 of the amplification circuit 30 is set at 1:1, the output voltage VO becomes VO=(V(T1)+V(T2))/2. Each level which divides the voltage between the two adjacent reference voltages (Vrk, Vr(k+1)) into two exhibits a linear property through an interpolation operation of the amplification circuit 30.

While FIG. 7A illustrates only 15 levels for the ease of illustration, the levels may be further increased. By increasing the number of levels, the number of bits of the corresponding digital data signal also increases.

In the specification of FIG. 7A, at the time when the worst case is an even-number level, the total of the parasitic capacitance of the input terminals T1 and T2 of the amplification circuit for each output becomes a load with respect to the wire of one reference voltage Vrk.

Meanwhile, at the time of an odd-number level, the total of the parasitic capacitance of the input terminal T1 of the amplification circuit for each output becomes a load with respect to the wire of the reference voltage Vrk, and the total of the parasitic capacitance of the input terminal T2 of the amplification circuit for each output becomes a load with respect to the wire of the reference voltage Vr(k+1). Therefore, regarding the total value of the parasitic capacitance of the input terminals of the amplification circuit with respect to one reference voltage, the case of an odd-number level is ½ of the case of an even-number levels. At this time, in the case where the number of outputs of the data driver increases, the difference in the total value of the parasitic capacitance affects the speeds of the voltage changes of the input terminals of the amplification circuit.

When the specification of FIG. 7A of this embodiment is applied, in the first period Tel immediately after the beginning of the one-data period, the first selection state is set, and the reference voltage Vrk, for example, is supplied to one (T1) of the input terminals T1 to T2 of the amplification circuit 30 independent of the gradation levels. The total of the parasitic capacitance of the input terminal T1 of the amplification circuit 30 which becomes the load of the wire of the reference voltage Vrk becomes ½ of the worst case in the conventional situation. Accordingly, the voltage change of the input terminal (T1) of the amplification circuit 30 can be fast, and a voltage change speed independent from the gradation levels can be realized. In addition, in the second period Tc2 after the first period Tel, the second selection state is set, and the reference voltages Vrk and Vr(k+1) are distributed to the input terminals T1 to T2 of the amplification circuit 30 in correspondence with the gradation levels and become stable quickly.

In the specification of FIG. 7B, the reference voltages Vr0, Vr1, Vr2, . . . , are set, as the reference voltage group, for every four levels with respect to four input terminals consisting of the input terminals T1 to T4 of the amplification circuit 30. The decoder 20 selects, as selection voltages V(T1), V(T2), V(T3), and V(T4) supplied to the input terminals T1 to T4 of the amplification circuit 30 during the one-data period, for example, the same reference voltage (Vrk, Vrk, Vrk, Vrk) for a level (4k), selects two adjacent reference voltages (Vrk, Vr(k+1), Vrk, Vrk) for a level (4k+1), selects two adjacent reference voltages (Vr(k+1), Vr(k+1), Vrk, Vrk) for a level (4k+2), and selects two adjacent reference voltages (Vrk, Vr(k+1), Vr(k+1), Vr(k+1)) for a level (4k+1). Here, k is an integer of 0 or more.

When the weighting ratio of the input terminals T1 T2, T3, and T4 of the amplification circuit is set at 1:1:1:1, the output voltage VO becomes VO=(V(T1)+V(T2)+V(T3)+V(T4))/4. Each level which divides the voltage between the two adjacent reference voltages (Vrk, Vr(k+1)) into four exhibits a linear property through an interpolation operation of the amplification circuit. While FIG. 7B illustrates only 24 levels for the ease of illustration, the levels may be further increased. By increasing the number of levels, the number of bits of the corresponding digital data signal also increases.

In the specification of FIG. 7B, at the time when the worst case is the level (4k), the total of the parasitic capacitance of the input terminals T1 to T4 of the amplification circuit for each output becomes a load with respect to the wire of one reference voltage Vrk. Meanwhile, at the time of the level (4k+1), the numbers of input terminals of the amplification circuit which become loads with respect to the respective wires of the reference voltages Vrk and Vr(k+1) are "3" and "1"; at the time of the level (4k+2), the numbers of input terminals of the amplification circuit which become loads with respect to the respective wires of the reference voltages Vrk and Vr(k+1) are "2" and "2"; and at the time of the level (4k+3), the numbers of input terminals of the amplification circuit which become loads with respect to the respective wires of the reference voltages Vrk and Vr(k+1) are "1" and "3".

Therefore, regarding the total value of the parasitic capacitance of the input terminals of the amplification circuit 30 with respect to one reference voltage, the total value is ¼ at minimum with respect to the level (4k) of the worst case. In the case where the number of outputs of the data driver increases, the difference in the total value of the parasitic capacitance affects the speeds of the voltage changes of the input terminals of the amplification circuit 30.

When the specification of FIG. 7B of this embodiment is applied, in the first period Tel immediately after the beginning of the one-data period, the first selection state is set, and the reference voltage Vrk, for example, is supplied to one (T1) of the input terminals T1 to T4 of the amplification circuit 30 independent of the gradation levels. At this time, the total of the parasitic capacitance of the input terminal T1 of the amplification circuit 30 which becomes the load of the wire of the reference voltage Vrk becomes ¼ of the worst case in the conventional situation. Accordingly, the voltage change of the input terminal (T1) of the amplification circuit 30 can be fast, and a voltage change speed independent from the gradation levels can be realized. In the second period Tc2 after the first period Tel, the second selection state is set, and the reference voltages Vrk and Vr(k+1) are distributed to the input terminals T1 to T4 of the amplification circuit 30 in correspondence with the gradation levels and become stable quickly.

According to the above, in the case where the embodiment is applied to the specifications of FIGS. 7A and 7B, the changes of the input voltages of the amplification circuit 30 can be accelerated, and the change speed of the output voltage of the amplification circuit 30 can be correspondingly accelerated. In addition, the change speeds of the output voltages of the amplification circuits for the respective gradation levels can be aligned.

Embodiment 2

Figure 8:
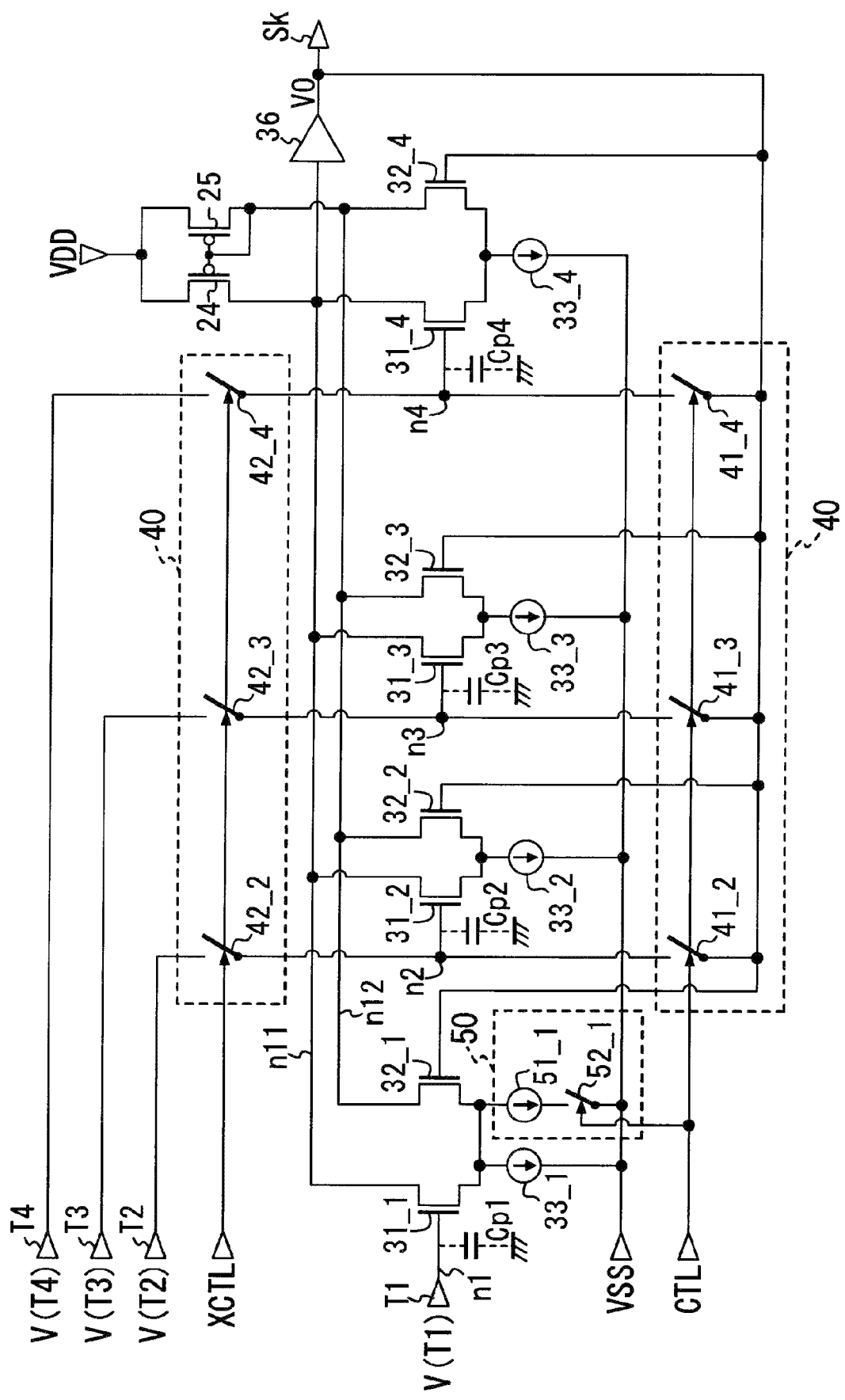
FIG. 8 is a circuit diagram illustrating an example of internal configurations of the amplification circuit 30, the selector 40, and the driving speed control circuit 50.

FIG. 8 illustrates a circuit diagram of an example of the internal configuration of the amplification circuit 30, the selector 40, and the driving speed control circuit 50 at the time when the number "x" of the input terminals of the amplification circuit 30 shown in FIG. 4 is set at four, and the number "m" of input terminals constantly receiving the signal output from the decoder is set at 1.

The amplification circuit 30 shown in FIG. 8 includes N-channel MOS transistors 31_1 to 31_4 and 32_1 to 32_4, current sources 33_1 to 334, P-channel MOS transistors 24 and 25, and a buffer amplifier 36. The selector 40 includes switches 41_2 to 41_4 and 42_2 to 42_4.

In FIG. 8, one terminal of the current source 33_1 is applied with a ground potential VSS, and the other terminal of the current source 33_1 is connected to the source of each of the transistors 31_1 and 32_1 forming the first differential pair. The current source 33_1 generates a current flowing to the first differential pair as a bias current. The input terminal T1 is connected to the gate of the transistor 31_1 via a node n1, and a node n11 is connected to the drain of the transistor 31_1. The output voltage VO of the amplification circuit 30 is applied to the gate of the transistor 32_1, and a node n12 is connected to the drain of the transistor 32_1.

One terminal of the current source 33_2 is applied with the ground potential VSS, and the other terminal of the current source 33_2 is connected to the source of each of the transistors 31_2 and 32_2 forming the second differential pair. The current source 33_2 generates a current flowing to the second differential pair as a bias current. The output voltage VO is applied to the gate of the transistor 31_2 via a node n2 and the switch 412, and the input terminal T2 is connected to the gate of the transistor 31_2 via the node n2 and the switch 42_2. In addition, the node n11 is connected to the drain of the transistor 31_2. The output voltage VO is applied to the gate of the transistor 32_2, and the node n12 is connected to the drain of the transistor 32_2. The switches 41_2 and 42_2 are set complementarily to one of the ON state and the OFF state in correspondence with the control signals (CTL, XCTL). At this time, in the case where the switch 41_2 is in the ON state and the switch 42_2 is in the OFF state, the output voltage VO is supplied to the gate of the transistor 31_2. In the case where the switch 41_2 is in the OFF state and the switch 42_2 is in the ON state, the voltage V(T2) received by the input terminal T2 is supplied to the gate of the transistor 31_2.

One terminal of the current source 33_3 is applied with the ground potential VSS, and the other terminal of the current source 33_3 is connected to the source of each of the transistors 31_3 and 32_3 forming the third differential pair. The current source 33_3 generates a current flowing to the third differential pair as a bias current. The output voltage VO is applied to the gate of the transistor 31_3 via a node n3 and the switch 41_3, and the input terminal T3 is connected to the gate of the transistor 313 via the node n3 and the switch 423. In addition, the node n11 is connected to the drain of the transistor 31_3. The output voltage VO is applied to the gate of the transistor 32_3 and the node n12 is connected to the drain of the transistor 32_3. The switches 41_3 and 42_3 are set complementarily to one of the ON state and the OFF state in correspondence with the control signals (CTL, XCTL). At this time, in the case where the switch 41_3 is in the ON state and the switch 42_3 is in the OFF state, the output voltage VO is supplied to the gate of the transistor 31_3. In the case where the switch 41_3 is in the OFF state and the switch 42_3 is in the ON state, the voltage V(T3) received by the input terminal T3 is supplied to the gate of the transistor 31_3.

One terminal of the current source 33_4 is applied with the ground potential VSS, and the other terminal of the current source 33_4 is connected to the source of each of the transistors 31_4 and 32_4 forming the fourth differential pair. The current source 33_4 generates a current flowing to the fourth differential pair as a bias current. The output voltage VO is applied to the gate of the transistor 31_4 via a node n4 and the switch 41_4, and the input terminal T4 is connected to the gate of the transistor 314 via the node n4 and the switch 424. In addition, the node n11 is connected to the drain of the transistor 31_4. The output voltage VO is applied to the gate of the transistor 32_4 and the node n12 is connected to the drain of the transistor 32_4. The switches 41_4 and 42_4 are set complementarily to one of the ON state and the OFF state in correspondence with the control signals (CTL, XCTL). At this time, in the case where the switch 41_4 is in the ON state and the switch 42_4 is in the OFF state, the output voltage VO is supplied to the gate of the transistor 31_4. In the case where the switch 41_4 is in the OFF state and the switch 42_4 is in the ON state, the voltage V(T4) received by the input terminal T4 is supplied to the gate of the transistor 31_4.

The transistors 24 and 25 form a current mirror circuit. The gate and the drain of the transistor 25 on the primary side of the current mirror circuit are connected to the node n12, and the drain of the transistor 24 on the secondary side is connected to the node n11. The gates of the transistors 24 and 25 are connected, and the sources thereof are applied with a power potential VDD.

The buffer amplifier 36 functions as an output circuit generating the output voltage VO by transmitting an amplification current corresponding to the voltage at the node n11 to the output terminal Sk. The buffer amplifier 36 as the output circuit outputs the output voltage VO via the output terminal Sk and supplies the output voltage VO to the respective gates of the transistors 32_1 to 32_4 and the switches 41_2 to 41_4.

Moreover, in the embodiment shown in FIG. 8, the driving speed control circuit 50 includes a current source 51_1 and a switch 52_1. The current source 51_1 is connected in parallel with the current source 31_1 which generates a bias current flowing to the first differential pair, i.e., the differential pair (31_1 to 31_2) including the first input terminal T1. One terminal of the current source 51_1 is connected to the switch 52_1, and the other terminal thereof is connected to the source of each of the transistors 31_1 and 32_1 forming the first differential pair. The switch 52_1 is set to the ON state and the OFF state in correspondence with the control signal CTL. In the case where the switch 52_1 is set to the ON state, the ground potential VSS is applied to one terminal of the current source 5_1, and in the case where the switch 52_1 is set to the OFF state, one terminal of the current source 51_1 is set to the OPEN state (high impedance state). Accordingly, in the case where the switch 52_1 is in the ON state in correspondence with the control signal CTL, the current source 51_1 flows a predetermined constant current, in addition to the bias current generated by the current source 33_1, to the first differential pair (31_1, 32_1).

The configurations of the amplification circuit 30 and the driving speed control circuit 50 correspond to the decoder 20 based on the specification of FIG. 7B. In the case where the weighting ratio among the input terminals T1, T2, T3, and T4 of the amplification circuit 30 shown in FIG. 8 is set at 1:1:1:1, for example, the differential pairs (31_1, 32_1), (31_2, 32_2), (31_3, 32_3), (314, 324) may be respectively formed by transistors of the same size, and the respective current values of the current sources 33_1, 332, 33_3, and 33_4 may be the same.

Figures 9A, 9B:
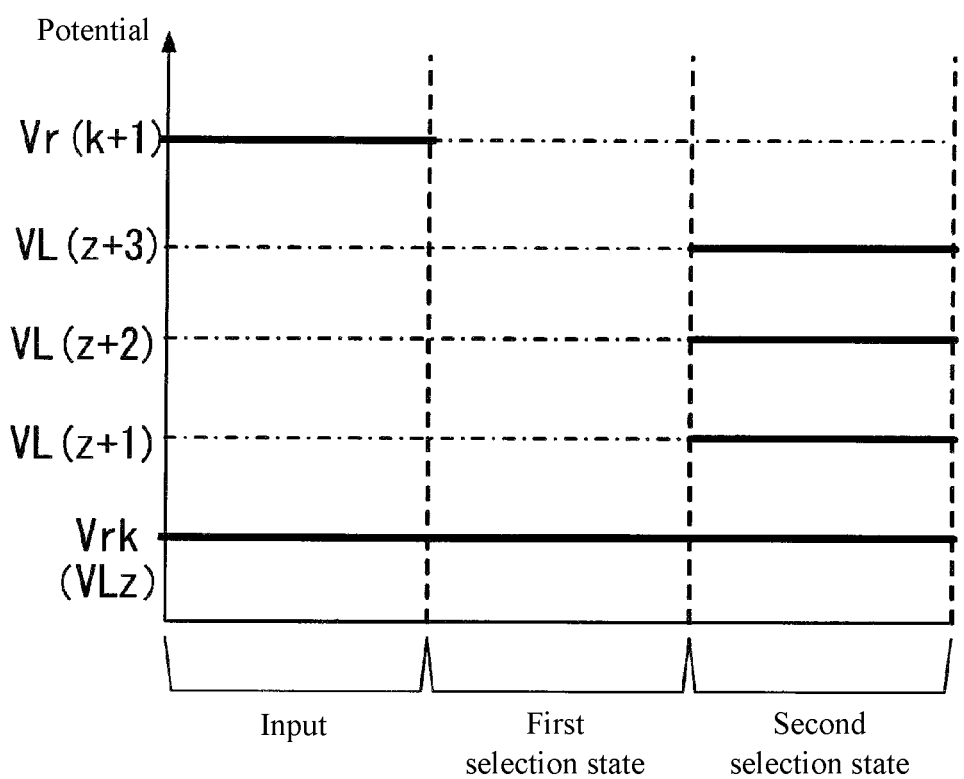
FIG. 9A is a diagram illustrating input/output states in the amplification circuit 30 and the driving speed control circuit 50 shown in FIG. 8 under the first selection state and the second selection state, respectively.
FIG. 9B is a diagram illustrating the input/output states in the amplification circuit 30 and the driving speed control circuit 50 shown in FIG. 8 under the first selection state and the second selection state, respectively.

FIGS. 9A and 9B are diagrams illustrating input/output states of the amplification circuit 30 and the driving speed control circuit 50 in each of the first selection state and the second selection state in the case where "x" shown in FIG. 5 is set at 4, and "m" shown in FIG. 5 is set at 1 in the configuration shown in FIG. 8. The states of the inverting input terminal FB and the selector 40 are the same as the states thereof shown in FIG. 5, so the descriptions thereof will be omitted.

In FIGS. 9A and 9B, the multiple reference voltages selected by the decoder 20 are set as two adjacent reference voltages Vrk and Vr(k+1) to represent the supply voltage and the output voltage to the input terminals of the amplification circuit 30 in the first selection state (the first period Tel) and the second selection state (the second period Tc2).

In the following, the operation of the configuration shown in FIG. 8 is described with reference to FIGS. 6, 9A, and 9B.

Firstly, in the first period Tel immediately after the beginning of the one-data period, the amplification circuit 30 and the driving speed control circuit 50 shown in FIG. 8 are set to the first selection state. That is, the switches 41_2, 413, and 414 receiving the control signal CTL are set to the ON state, and the switches 42_2, 423, and 42_4 receiving the control signal XCTL are set to the OFF state. In addition, the switch 52_1 of the driving speed control circuit 50 is changed to the ON state, and the current source 51_1 is activated (operating). Here, among the first to fourth input terminals of the amplification circuit 30, the reference voltage Vrk selected based on the video digital data is input to the first input terminal T1, and the output voltage VO (=Vrk) of the amplification circuit is supplied to the second to fourth input terminals T2 to T4.

Accordingly, in the first period Tel, compared with the conventional worst case in which the same reference voltage Vrk is selected for all the input terminals of the amplification circuit 30 for each output of the data driver, the parasitic capacitance of the input terminals of the amplification circuit 30 which becomes the load of the wire of the reference voltage Vrk is only the first input terminal T1. Accordingly, the voltage change of the first input terminal T1 of the amplification circuit 30 is accelerated. Also, since the differential pairs including the second to fourth input terminals T2 to T4 do not contribute to the differential amplification operation, by activating (operating) the driving speed control circuit 50 (the current source 51_1, the switch 52_1), the differential amplification operation of the differential pair (31_1, 32_1) including the first input terminal T1 is accelerated. Accordingly, the driving speed of the amplification circuit 30 can be prevented from decreasing, and a favorable driving speed is maintained. As an example, the current of the current source 51_1 of the driving speed control circuit 50 may be the same as the total of the current sources 33_2 to 33_4 driving the differential pairs including the input terminals T2 to T4. In addition, instead of additionally providing the current source 51_1, the driving speed control circuit 50 may also be configured to increase the current by switching the bias voltage setting the current value of the current source 33_1. Accordingly, the voltage change of the input terminal (T1) of the amplification circuit 30 can be fast, and a voltage change speed independent from gradation levels can be realized.

Then, in the second period Tc2 following the first period Tel, the amplification circuit 30 and the driving speed control circuit 50 shown in FIG. 8 are set to the second selection state. That is, the switches 412, 413, and 41_4 receiving the control signal CTL are set to the OFF state, and the switches 42_2, 423, and 42_4 receiving the control signal XCTL are set to the ON state. In addition, the switch 52_1 of the driving speed control circuit 50 is changed to the OFF state, and the current source 51_1 is inactivated (stopped). Here, the first input terminal T1 continues to be supplied with the reference voltage Vrk, and the second to fourth terminals T2 to T4 are respectively supplied with the reference voltage Vrk or Vr(k+1) selected based on the video digital data.

Accordingly, the amplification circuit 30 operates normally, and the output voltage VO quickly reaches the target voltage and becomes stable.

In the first selection state, since the decoder 20 selects and outputs the reference voltage Vrk as one of the reference voltages Vrk and Vr(k+1), the amplification circuit 30 outputs the output voltage VO having a voltage VLz at the same potential as the reference voltage Vrk.

Meanwhile, in the second selection state, since the decoder 20 selects and outputs the two reference voltages Vrk and Vr(k+1) with overlapping, the amplification circuit 30 outputs the output voltage VO having one of voltages VLz to VL(z+3) with four levels formed by internally dividing the two reference voltages Vrk and Vr(k+1).

At the switching from the first selection state to the second selection state, the voltage change is equal to or less than the potential difference of the number of levels between the two reference voltages Vrk and Vr (k+1) minus 1, and the difference is at maximum three gradation levels of the output voltage VL (z+3) from VLz. However, the voltage difference between the two reference voltages Vrk and Vr(k+1) is sufficiently small with respect to the voltage range of the reference voltage group VX of FIG. 3, so the output voltage VO may quickly reach the target voltage with respect to the difference of three gradation levels between the two reference voltages Vrk and Vr(k+1).

Figure 10:
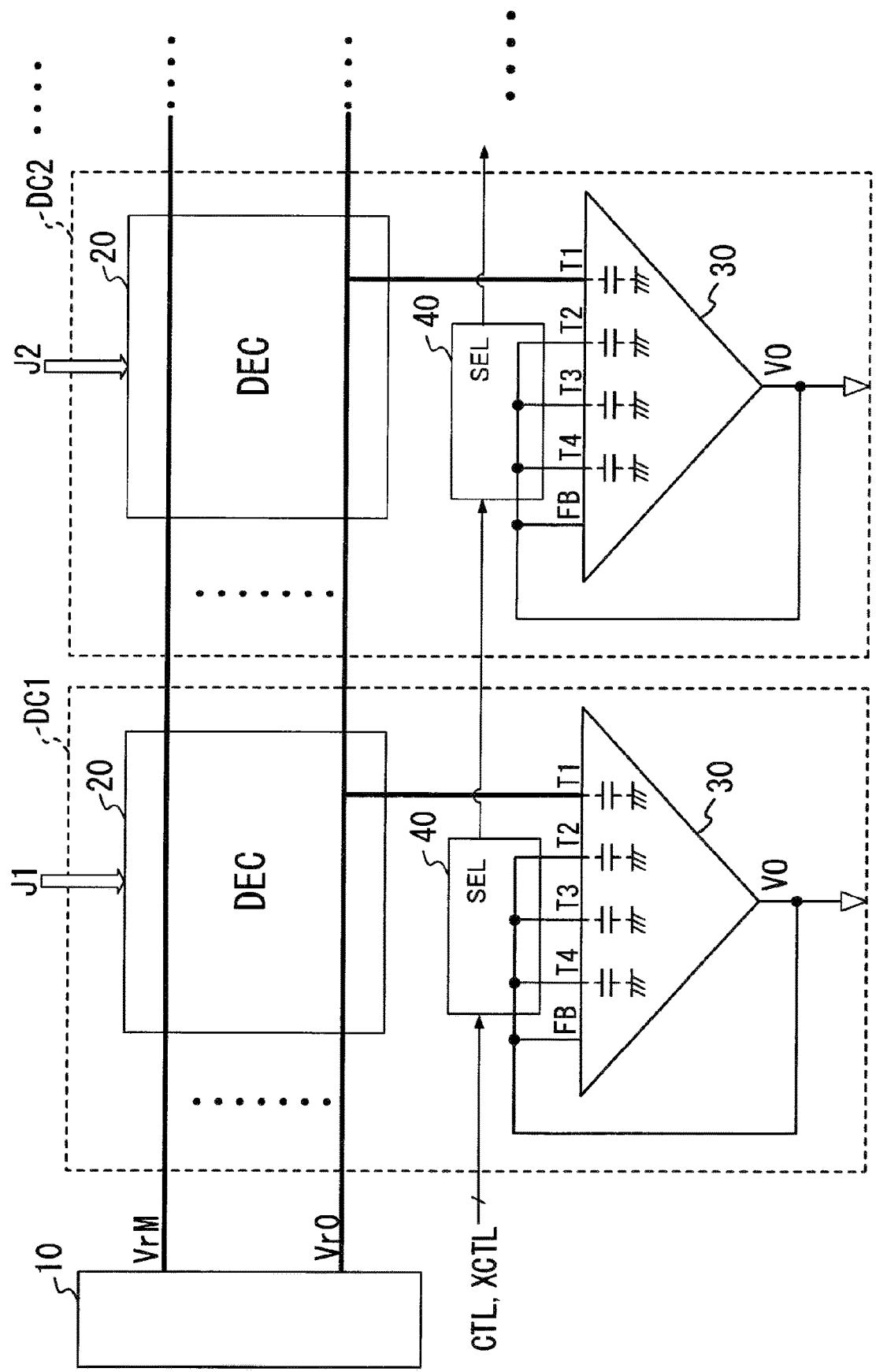
FIG. 10 is a diagram schematically illustrating an example of states in a decoder 20, the amplification circuit 30, and the selector 40 during a first period Tel.

In the following, the acceleration of the amplification circuit 30 carried out in the first selection state is described with reference to FIG. 10. In FIG. 10, an equivalent circuit of a gradation voltage generation circuit 10, the decoder 20, the amplification circuit 30, and the selector 40 in the first selection state is shown.

As shown in FIG. 10, in the first selection state (the first period Tel), only one input terminal (T1) of each amplification circuit 30 is connected to the wire supplying the predetermined reference voltage (Vr0). At this time, the amplification circuit 30 outputs, as the output voltage VO, a voltage in which the reference voltage (Vr0) supplied to the input terminal (T1) is amplified.

Accordingly, the total of the parasitic capacitance of the input terminals of the amplification circuit 30 connected to the wire of one reference voltage Vr0 is cut to ¼ of the case where the total of the parasitic capacitance of the input terminals of the amplification circuit 30 is the total of the parasitic capacitance of all the input terminals (T1 to T4) as in the conventional worst case. Thus, the voltage change of the input terminal (T1) of the amplification circuit 30 can be significantly accelerated, and the difference of voltage change speeds of the input terminals of the amplification circuit 30 due to the difference in length among wires from the reference voltage generation circuit 10 can also be reduced.

Moreover, since only one input terminal (T1) of the amplification circuit 30 is supplied with the reference voltage, regardless of gradation levels, in the first selection state, the voltage change speeds of the input terminals of the amplification circuit 30 are unified regardless of gradation levels.

Thus, in the embodiment, the voltage change speeds of the input terminals of the amplification circuit 30 in the first selection state are accelerated, and the variation among change speeds is suppressed. Consequently, the signal delay and the delay variation of the output voltages VO of the amplification circuits 30 driving the data lines D1 to Dn of the display device 200 can be reduced, and a favorable display quality can be realized.

Embodiment 3

Figure 11:
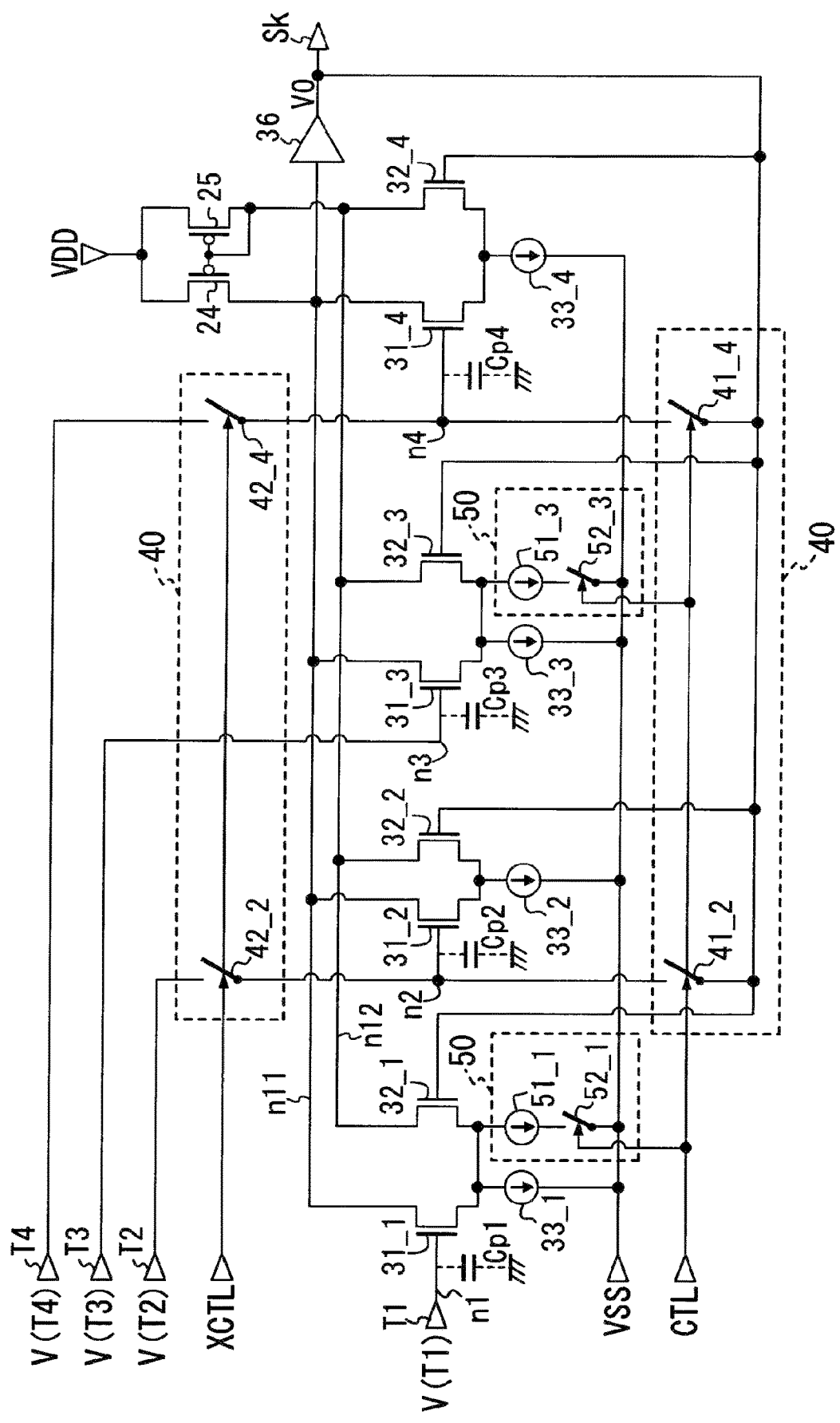
FIG. 11 is a circuit diagram illustrating another example of the internal configurations of the amplification circuit 30, the selector 40, and the driving speed control circuit 50.

FIG. 11 illustrates a circuit diagram of the internal configuration of the amplification circuit 30, the selector 40, and the driving speed control circuit 50 in the case where the number "x" of the input terminals of the amplification circuit 30 shown in FIG. 4 is set at four, and the number "m" of input terminals constantly receiving the signal selected and output by the decoder is set at 2. In the configuration shown in FIG. 11, the switch 41_3 and the switch 42_3 are omitted from the selector 40 shown in FIG. 8, and, as the driving speed control circuit 50, a current source 51_3 and a switch 52_3 other than the current source 51_1 and the switch 52_1 are additionally provided. Except for the above, the configuration is the same as the configuration shown in FIG. 8. Besides, the decoder 20 corresponds to the specification of FIG. 7B.

That is, in the configuration shown in FIG. 11, the input terminal T3 is connected to the gate of the transistor 31_3 forming the third differential pair. Moreover, the current source 51_3 and the switch 52_3 as the driving speed control circuit 50 are connected in parallel with the current source 33_3 which generates a bias current flowing to the transistors 31_3 and 32_3 forming the third differential pair.

Figures 12A, 12B:
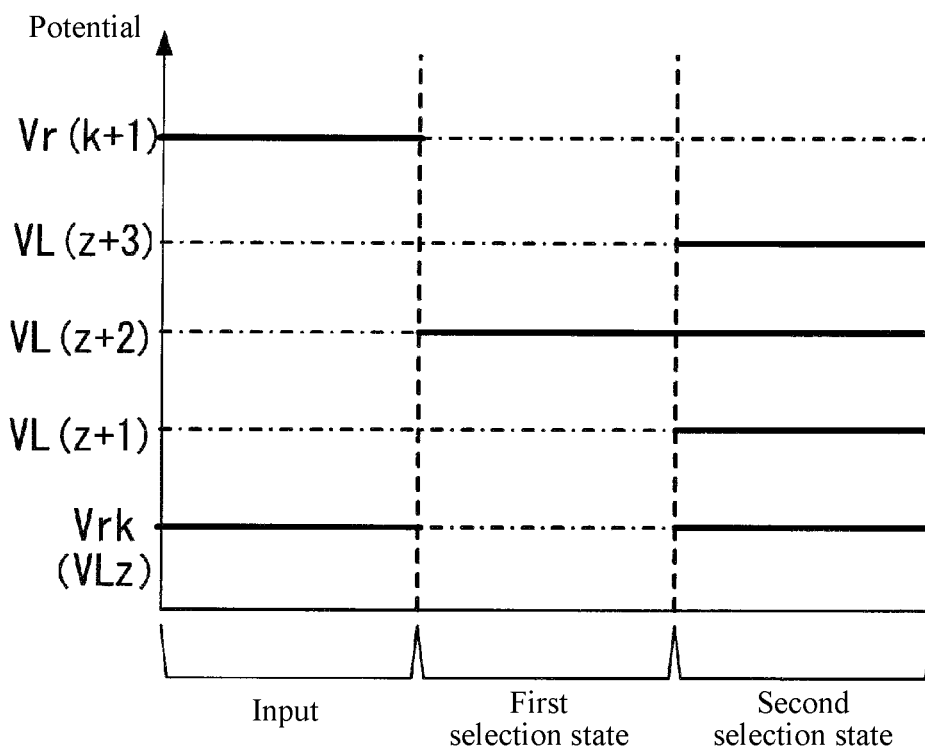
FIG. 12A is a diagram illustrating the input/output states in the amplification circuit 30 and the driving speed control circuit 50 shown in FIG. 11 under each of the first selection state and the second selection state, respectively.
FIG. 12B is a diagram illustrating the input/output states in the amplification circuit 30 and the driving speed control circuit 50 shown in FIG. 11 under each of the first selection state and the second selection state, respectively.

FIGS. 12A and 12B are diagrams illustrating input/output states of the amplification circuit 30 and the driving speed control circuit 50 in each of the first selection state and the second selection state in the case where "x" shown in FIG. 5 is set at 4, and "m" shown in FIG. 5 is set at 2 in the configuration shown in FIG. 11. The states of the inverting input terminal FB and the selector 40 are the same as the states thereof shown in FIG. 5, so the descriptions thereof will be omitted.

In FIGS. 12A and 12B, the multiple reference voltages selected by the decoder 20 are set as two adjacent reference voltages Vrk and Vr(k+1) to represent the supply voltage and the output voltage to the input terminals of the amplification circuit 30 in the first selection state (the first period Tel) and the second selection state (the second period Tc2).

In the following, the operation of the configuration shown in FIG. 11 is described with reference to FIGS. 6, 12A, and 12B.

Firstly, in the first period Tel immediately after the beginning of the one-data period, the amplification circuit 30 and the driving speed control circuit 50 shown in FIG. 11 are set to the first selection state. That is, the switches 41_2 and 41_4 receiving the control signal CTL are set to the ON state, and the switches 42_2 and 424 receiving the control signal XCTL are set to the OFF state. In addition, the switches 52_1 and 52_3 of the driving speed control circuit 50 are changed to the ON state, and the current sources 51_1 and 51_3 are activated (operating). Here, among the first to fourth input terminals of the amplification circuit 30, the reference voltage Vrk and the reference voltage Vr(k+1) selected based on the video digital data are respectively input to the first input terminal T1 and the third input terminal T3, and the output voltage VO of the amplification circuit is supplied to the second input terminal T2 and the fourth input terminal T4. At this time, when the weighting ratios set to the input terminals T1 and T3 are equal, the output voltage VO becomes an intermediate voltage (Vrk+Vr(k+1))/2 of the reference voltages Vrk and Vr(k+1).

Accordingly, in the first period Tel, compared with the conventional worst case in which the same reference voltage Vrk is selected for all the input terminals of the amplification circuit for each output of the data driver, the parasitic capacitance of the input terminals of the amplification circuit 30 which becomes the load of the wire of the reference voltage Vrk is only the first input terminal T1. Moreover, the parasitic capacitance of the input terminals of the amplification circuit 30 which becomes the load of the wire of the reference voltage Vr(k+1) is only the third input terminal T3. Accordingly, the respective voltage changes of the first input terminal T1 and the third input terminal T3 of the amplification circuit 30 are accelerated.

Also, since the differential pairs including the second and fourth input terminals T2 and T4 do not contribute to the differential amplification operation, by activating (operating) the driving speed control circuit 50 (the current sources 51_1 and 51_3, the switches 52_1 and 52_3), the differential amplification operation of the differential pair (31_1, 32_1) including the first input terminal T1 and the differential pair (31_3, 32_3) including the third input terminal T3 are accelerated. Accordingly, the driving speed of the amplification circuit 30 can be prevented from decreasing, and a favorable driving speed is maintained. As an example, the total current of the current sources 51_1 and 51_3 of the driving speed control circuit 50 may be the same as the total current of the current sources 33_2 and 33_4 driving the differential pairs including the input terminals T2 and T4. Accordingly, the voltage changes of the input terminals (T1, T3) of the amplification circuit 30 can be fast, and a voltage change speed independent from gradation levels can be realized.

Then, in the second period Tc2 following the first period Tel, the amplification circuit 30 and the driving speed control circuit 50 shown in FIG. 11 are set to the second selection state. That is, the switches 41_2 and 41_4 receiving the control signal CTL are set to the OFF state, and the switches 42_2 and 42_4 receiving the control signal XCTL are set to the ON state. In addition, the switches 52_1 and 52_3 of the driving speed control circuit 50 are changed to the OFF state, and the current sources 51_1 and 51_3 are inactivated (stopped). Here, the reference voltage Vrk or the reference voltage Vr(k+1) selected based on the video digital data include overlapping and are respectively supplied to the first to fourth input terminals T1 to T4 of the amplification circuit 30. Accordingly, the amplification circuit 30 operates normally, and the output voltage VO quickly reaches the target voltage and becomes stable.

In the first selection state, since the decoder 20 selects and outputs the two reference voltages Vrk and Vr(k+1), the amplification circuit 30 outputs the output voltage VO having an intermediate voltage VL(z+2) of the reference voltages Vrk and Vr(k+1).

Meanwhile, in the second selection state, since the decoder 20 selects and outputs the two reference voltages Vrk and Vr(k+1) with overlapping, the amplification circuit 30 outputs the output voltage VO having one of the voltages VLz to VL(z+3) with four levels formed by internally dividing the two reference voltages Vrk and Vr(k+1).

At the switching from the first selection state to the second selection state, the voltage change is equal to or less than ½ of the potential difference between the two reference voltages Vrk and Vr (k+1), and the voltage change is at maximum a difference of two gradation levels of the output voltage VL (z+2) from VLz. However, the voltage difference between the two reference voltages Vrk and Vr(k+1) is sufficiently small with respect to the voltage range of the reference voltage group VX of FIG. 3, so the output voltage VO may quickly reach the target voltage with respect to the difference of two gradation levels between the two reference voltages Vrk and Vr(k+1).

Figure 13:
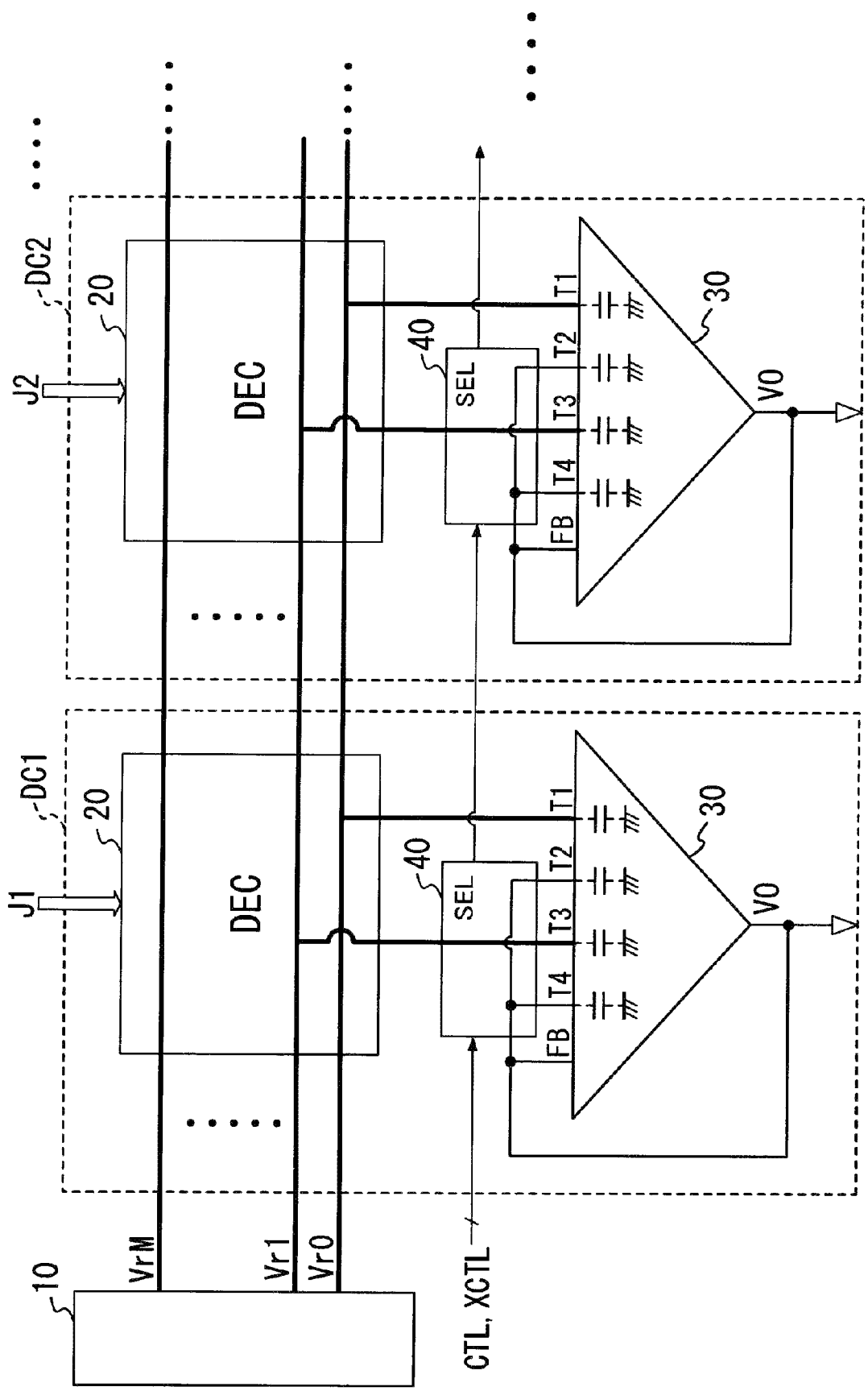
FIG. 13 is a diagram schematically illustrating another example of the states in the decoder 20, the amplification circuit 30, and the selector 40 during the first period Tel.

In the following, the acceleration of the amplification circuit 30 carried out in the first selection state is described with reference to FIG. 13. In FIG. 13, an equivalent circuit of a gradation voltage generation circuit 10, the decoder 20, the amplification circuit 30, and the selector 40 in the first selection state is shown.

As shown in FIG. 13, in the first selection state (the first period Tel), two input terminals T1 and T3 of each amplification circuit 30 are connected to the respective wires of the respectively different reference voltages Vr0 and Vr1. At this time, the amplification circuit 30 outputs the output voltage VO having the intermediate voltage of the reference voltages Vr0 and Vr1 supplied to the input terminals T1 and T3.

Accordingly, the total of the parasitic capacitance of the input terminals of the amplification circuit 30 connected to the wire of one reference voltage (Vr0 or Vr1) is cut to ¼ of the case where the total of the parasitic capacitance of the input terminals of the amplification circuit 30 is the total of the parasitic capacitance of all the input terminals (T1 to T4) as in the conventional worst case. Thus, the voltage changes of the input terminals (T1, T3) of the amplification circuit 30 can be significantly accelerated, and the difference in voltage change speed of the input terminals of the amplification circuit 30 due to the difference in length among wires from the reference voltage generation circuit 10 can also be reduced.

Moreover, in the first selection state, since two input terminals (T1, T3) of the amplification circuit 30 are supplied with respectively different reference voltages irrelevant of gradation levels, the voltage change speeds of the input terminals of the amplification circuit 30 are unified regardless of gradation levels.

Therefore, according to the embodiment, the voltage change speeds of the input terminals of the amplification circuit 30 in the first selection state are accelerated, and the variation of change speeds is suppressed. Therefore, the signal delay or the delay variation of the output voltage VO of the amplification circuit 30 driving the data lines of the display device can be reduced, and a favorable display quality can be realized.

Moreover, while the driving speed control circuit 50 is included in the conversion circuit DC1 as the digital-to-analog circuit in an example shown in FIG. 4, the driving speed control circuit 50 may also be omitted in the case where the driving speed in the first selection state merely decreases slightly.

In brief, as the digital-to-analog circuit, it suffices as long as a reference voltage generation part, a decoder, a selector, and an amplification circuit as follow are included.

That is, the reference voltage generation part (10) generates a reference voltage group (VX) having voltage values different from each other. The decoder (20) receives a digital data signal (e.g., J1), selects multiple reference voltages with overlapping from the reference voltage group based on the digital data signal and outputs the multiple reference voltages. The amplification circuit (30) has first to $x^{th}$ input terminals (T1 to Tx), and outputs, as an output voltage (VO), a voltage amplified by averaging the multiple reference voltages respectively received by the first to $x^{th}$ input terminals with predetermined weighting ratios. The selector (40) receives a control signal (CTL, XCTL) specifying a first selection state or a second selection state, and switches voltages supplied to (x-m) input terminals (Tm+1 to Tx) excluding m input terminals (T1 to Tm) among the first to $x^{th}$ input terminals (T1 to Tx) of the amplification circuit (30) in correspondence with the first selection state or the second selection state. In a case where the control signal indicates the first selection state, the selector (40) supplies the output voltage (VO) of the amplification circuit itself to the (x-m) input terminals (Tm+1 to Tx) among the first to $x^{th}$ input terminals of the amplification circuit. In a case where the control signal indicates the second selection state, the multiple reference voltages output from the decoder are supplied to the (x-m) input terminals.

What is claimed is:

1. A digital-to-analog conversion circuit, comprising:
a reference voltage generation part, generating a reference voltage group having voltage values different from each other;
a decoder, receiving a digital data signal, selecting a plurality of reference voltages with overlapping from the reference voltage group based on the digital data signal, and outputting the reference voltages;
an amplification circuit, having first to $x^{th}$ input terminals, x being an integer of 2 or more, and outputting, as an output voltage, a voltage amplified by averaging the reference voltages respectively received by the first to $x^{th}$ input terminals with predetermined weighting ratios, wherein the output voltage is feedback to an feedback input end of the amplification circuit; and
a selector, receiving a control signal specifying a first selection state or a second selection state and the output voltage of the amplification circuit, and switching voltages supplied to (x-m) input terminals excluding m input terminals, m being an integer of 1 or more and less than x, among the first to $x^{th}$ input terminals of the amplification circuit in correspondence with the first selection state or the second selection state,
wherein in a case where the control signal indicates the first selection state, the selector supplies the output voltage to the (x-m) input terminals among the first to $x^{th}$ input terminals of the amplification circuit, and in a case where the control signal indicates the second selection state, the selector supplies the reference voltages to the (x-m) input terminals.

2. The digital-to-analog conversion circuit as claimed in claim 1, wherein the amplification circuit is an operational amplifier in which the first to $x^{th}$ input terminals are non-inverting input terminals, and the output voltage is supplied to an inverting input terminal of the amplification circuit itself.

3. The digital-to-analog conversion circuit as claimed in claim 1, wherein the amplification circuit comprises:
a differential stage circuit comprising first to $x_{th}$ differential pairs of a same conductivity type;
a current mirror circuit commonly connected to output terminals of the differential pairs; and
an output circuit outputting the output voltage via an output terminal,
wherein an input end of one of each of the first to $x^{th}$ differential pairs forms an input terminal among the first to $x^{th}$ input terminals of the amplification circuit, and an input end of another of each of the first to $x^{th}$ differential pairs is feedback-connected to the output terminal, and
the output circuit receives a voltage of at least one of output terminals of the differential pairs and a connection node pair of the current mirror circuit and generates the output voltage corresponding to the voltage.

4. The digital-to-analog conversion circuit as claimed in claim 2, wherein the amplification circuit comprises:
a differential stage circuit comprising first to $x_{th}$ differential pairs of a same conductivity type;
a current mirror circuit commonly connected to output terminals of the differential pairs; and
an output circuit outputting the output voltage via an output terminal,
wherein an input end of one of each of the first to $x^{th}$ differential pairs forms an input terminal among the first to $x^{th}$ input terminals of the amplification circuit, and an input end of another of each of the first to $x^{th}$ differential pairs is feedback-connected to the output terminal, and
the output circuit receives a voltage of at least one of output terminals of the differential pairs and a connection node pair of the current minor circuit and generates the output voltage corresponding to the voltage.

5. The digital-to-analog conversion circuit as claimed in claim 1, wherein, in correspondence with the control signal, the amplification circuit is set to the first selection state during a first period at a beginning of a data period for each predetermined data period, and is set to the second selection state during a second period following the first period.

6. The digital-to-analog conversion circuit as claimed in claim 2, wherein, in correspondence with the control signal, the amplification circuit is set to the first selection state during a first period at a beginning of a data period for each predetermined data period, and is set to the second selection state during a second period following the first period.

7. The digital-to-analog conversion circuit as claimed in claim 1, wherein in the amplification circuit, a total of the weighting ratios set for the respective m input terminals is set to be ½ or less than a total of the weighting ratios set for the respective first to $x^{th}$ input terminals.

8. The digital-to-analog conversion circuit as claimed in claim 1, wherein in the amplification circuit, the m is set to be a positive integer that is ½ or less than the x.

9. The digital-to-analog conversion circuit as claimed in claim 1, comprising a driving speed control circuit set to an active state or an inactive state in correspondence with the control signal and, in a case of being set to the active state, performing control on a driving speed of the amplification circuit,
wherein the driving speed control circuit is changed to the active state in a case where the control signal indicates the first selection state and changed to the inactive state in a case where the control signal indicates the second selection state, thereby making the driving speed of the amplification circuit equal in the first selection state and the second selection state.

10. The digital-to-analog conversion circuit as claimed in claim 9, wherein the amplification circuit comprises first to $x^{th}$ differential pairs and first to $x^{th}$ current sources, wherein one input end of each of the first to $x^{th}$ differential pairs forms one of the first to $x^{th}$ input terminals, and the first to $x^{th}$ current sources individually generate currents flowing to the respective first to $x^{th}$ differential pairs,
the driving speed control circuit comprises a current increasing means which increases a current value of at least one current source of m current sources generating the currents flowing to respective differential pairs forming the m input terminals among the first to $x^{th}$ input terminals, and in the case where the control signal indicates the first selection state, the driving speed control circuit activates the current increasing means, and in the case where the control signal indicates the second selection state, the driving speed control circuit inactivates the current increasing means.

11. The digital-to-analog conversion circuit as claimed in claim 10, wherein the current increasing means exerts control so that a total of current values of the m current sources in the first selection state in which the current increasing means is activated is at an equal degree to a total of the current values of the first to $x^{th}$ current sources of the second selection state.

12. A data driver, generating, as an output voltage, a voltage having a voltage value corresponding to a brightness level represented in a video data signal, and applying the output voltage to a display panel, wherein the data driver comprises:
- a reference voltage generation part, generating a reference voltage group having voltage values different from each other;
- a decoder, receiving the video data signal, selecting a plurality of reference voltages with overlapping corresponding to the brightness level represented in the video data signal from the reference voltage group, and outputting the reference voltages;
- an amplification circuit, having first to $x^{th}$ input terminals, x being an integer of 2 or more, and generating, as the output voltage, a voltage amplified by averaging the reference voltages respectively received by the first to $x^{th}$ input terminals with predetermined weighting ratios, wherein the output voltage is feedback to an feedback input end of the amplification circuit; and
- a selector, receiving a control signal specifying a first selection state or a second selection state and the output voltage of the amplification circuit, and switching voltages supplied to (x-m) input terminals excluding m input terminals, m being an integer of 1 or more and less than x, among the first to $x^{th}$ input terminals of the amplification circuit in correspondence with the first selection state or the second selection state,
- wherein in a case where the control signal indicates the first selection state, the selector supplies the output voltage to the (x-m) input terminals among the first to $x^{th}$ input terminals of the amplification circuit, and in a case where the control signal indicates the second selection state, the selector supplies the reference voltages to the (x-m) input terminals.

13. A display device, comprising:
- a display panel; and
  - a data driver, generating, as an output voltage, a voltage having a voltage value corresponding to a brightness level represented in a video data signal and applying the output voltage to the display panel,
- wherein the data driver comprises:
- a reference voltage generation part, generating a reference voltage group having voltage values different from each other;
- a decoder, receiving the video data signal, selecting a plurality of reference voltages with overlapping corresponding to the brightness level represented in the video data signal from the reference voltage group, and outputting the reference voltages;
- an amplification circuit, having first to $x^{th}$ input terminals, x being an integer of 2 or more, and generating, as the output voltage, a voltage amplified by averaging the reference voltages respectively received by the first to $x^{th}$ input terminals with predetermined weighting ratios, wherein the output voltage is feedback to an feedback input end of the amplification circuit; and
- a selector, receiving a control signal specifying a first selection state or a second selection state and the output voltage of the amplification circuit, and switching voltages supplied to (x-m) input terminals excluding m input terminals, m being an integer of 1 or more and less than x, among the first to $x^{th}$ input terminals of the amplification circuit in correspondence with the first selection state or the second selection state,
- wherein in a case where the control signal indicates the first selection state, the selector supplies the output voltage to the (x-m) input terminals among the first to $x^{th}$ input terminals of the amplification circuit, and in a case where the control signal indicates the second selection state, the selector supplies the reference voltages to the (x-m) input terminals.

* * * * *